United States Patent [19]
Scott

[11] Patent Number: 6,118,072
[45] Date of Patent: Sep. 12, 2000

[54] DEVICE HAVING A FLEXIBLE CIRCUIT DISPOSED WITHIN A CONDUCTIVE TUBE AND METHOD OF MAKING SAME

[75] Inventor: Richard Scott, Socorro, N. Mex.

[73] Assignee: Teledyne Technologies Incorp., Los Angeles, Calif.

[21] Appl. No.: 08/984,383

[22] Filed: Dec. 3, 1997

[51] Int. Cl.$^7$ ..................................................... H02G 3/08
[52] U.S. Cl. .................... 174/52.1; 174/52.5; 174/52.6; 174/254; 439/77; 361/749; 333/241
[58] Field of Search ................... 174/52.1, 52.5, 174/52.6, 254; 439/77; 361/736, 724, 737, 748, 749; 333/239, 241, 292

[56] References Cited

U.S. PATENT DOCUMENTS

| | | | |
|---|---|---|---|
| 3,755,717 | 8/1973 | Shaw | 361/751 |
| 3,873,889 | 3/1975 | Leyba . | |
| 4,126,370 | 11/1978 | Nijman . | |
| 4,376,927 | 3/1983 | McGalliard . | |
| 4,412,272 | 10/1983 | Wedertz et al. . | |
| 4,431,977 | 2/1984 | Sokola et al. . | |
| 4,510,551 | 4/1985 | Brainard, II | 361/684 |
| 4,792,879 | 12/1988 | Bauknecht et al. . | |
| 4,928,206 | 5/1990 | Porter et al. . | |
| 4,990,948 | 2/1991 | Sasaki et al. | 396/542 |
| 5,030,933 | 7/1991 | Ikeda . | |
| 5,468,159 | 11/1995 | Brodsky et al. | 439/501 |
| 5,493,074 | 2/1996 | Murata et al. | 174/254 |
| 5,576,673 | 11/1996 | Asija . | |
| 5,818,692 | 10/1998 | Denney, Jr. et al. . | |

OTHER PUBLICATIONS

M.A.R. Gunston, *Microwave Transmission–Line Impedance Data*, 1972, p. 52, London.
G. Matthaei, L. Young, E.M.T. Jones, *Microwave Filters, Impedance–Matching Networks, and Coupling Structures*, pp. 355–380, Dedham, MA.
H.C. Okeans, *Properties of a TEM Transmission Line Used in Microwave Integrated Circuit Applications*, Transactions of the I.E.E.E., MTT–15 pp. 327–328, May, 1967.

*Primary Examiner*—Dean A. Reichard
*Assistant Examiner*—Dhiru R Patel
*Attorney, Agent, or Firm*—Robert Pugh; Patrick Viccaro

[57] ABSTRACT

A device including a flexible circuit disposed within a conductive tube. The circuit may include a flexible substrate and one or more circuit elements. The circuit may have circuit elements on one or both sides, and the substrate may be multi-layered. The tube may have any one of many cross-sectional shapes, including circular, oval, square, and rectangular.

42 Claims, 19 Drawing Sheets

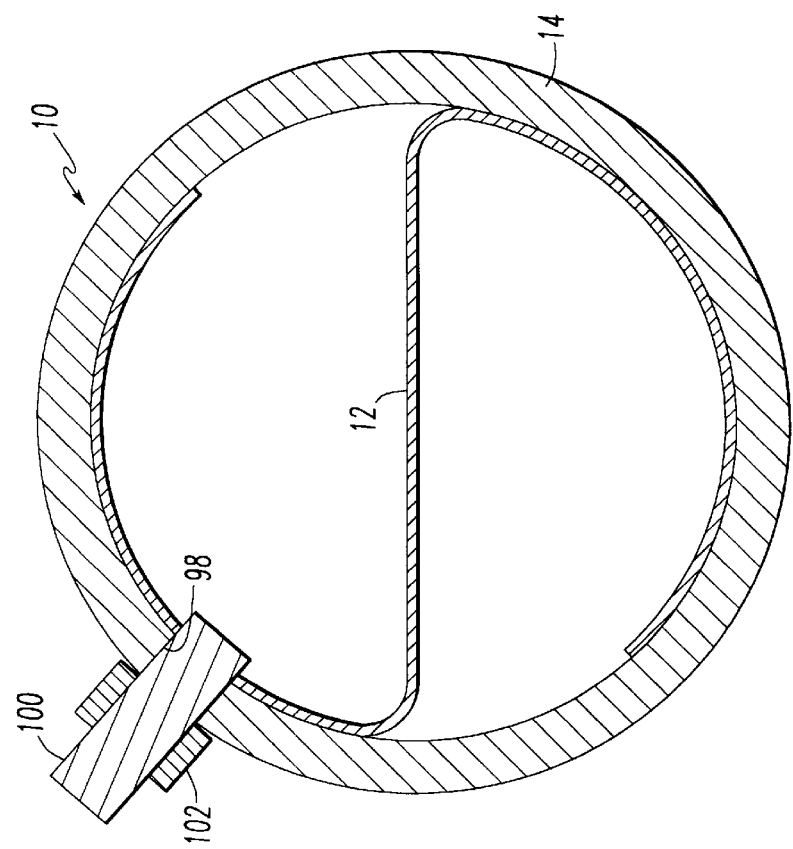
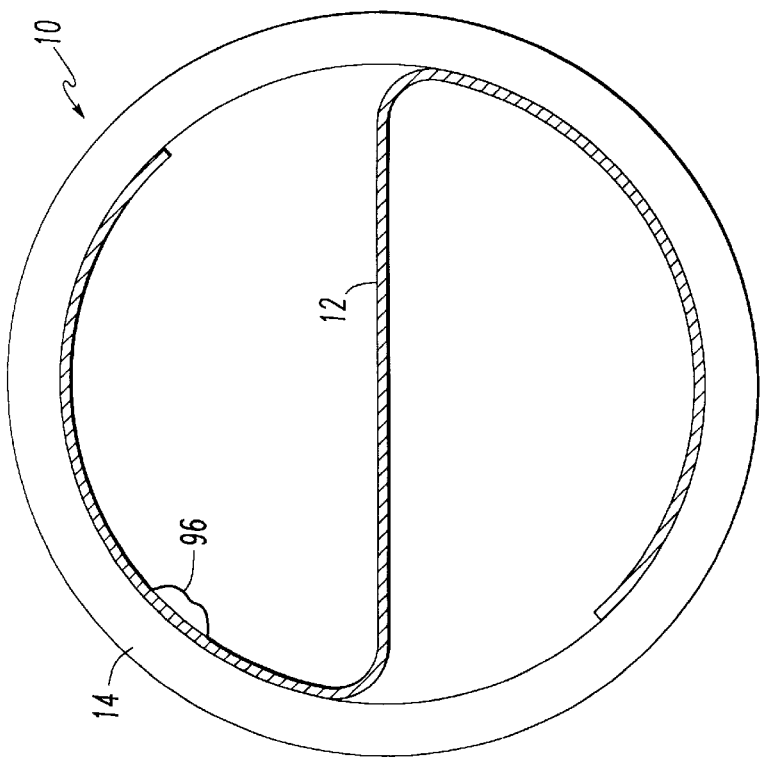

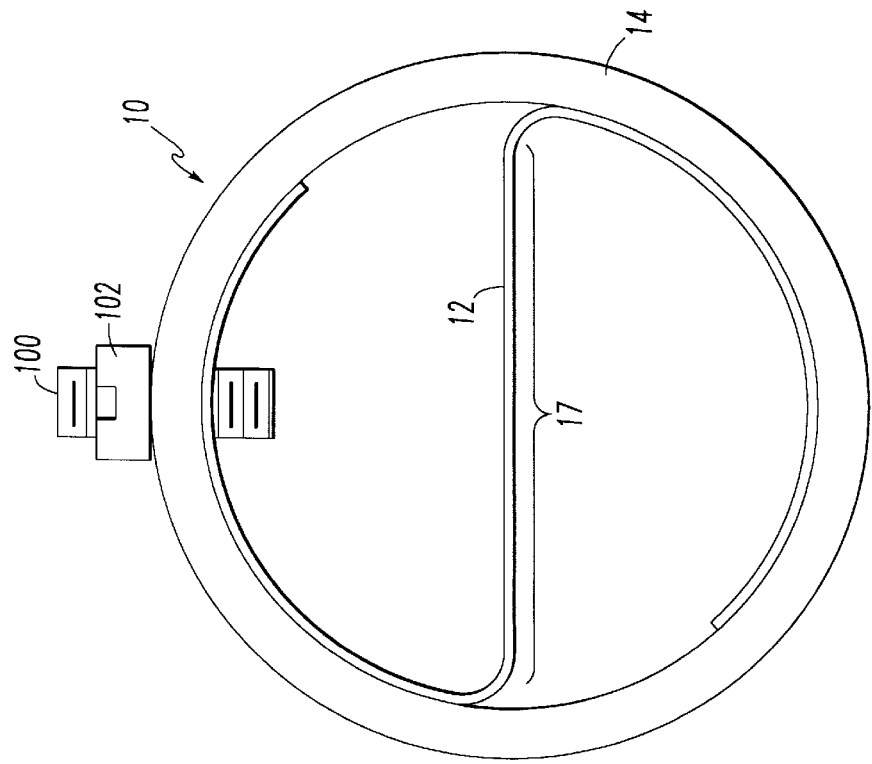
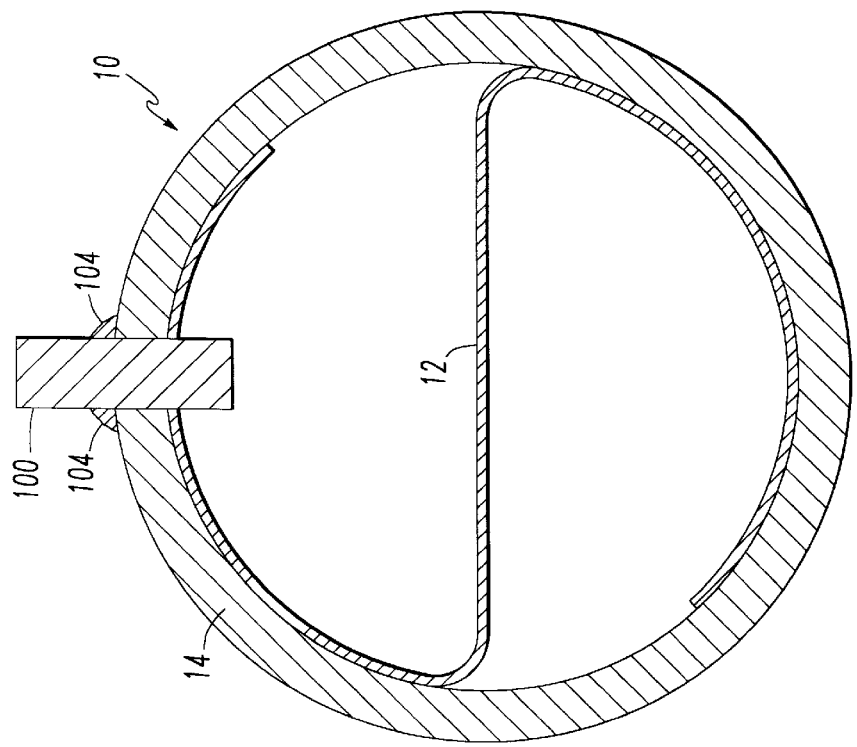

DEVICE HAVING A FLEXIBLE CIRCUIT DISPOSED WITHIN A CONDUCTIVE TUBE AND METHOD OF MAKING SAME

CROSS REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention is directed generally to a device including a flexible circuit disposed within a conductive tube and a method of making the device. The device may be any one of many devices, such as filters, directional couplers, power dividers, amplifiers, microwave mixers, and microwave fuses.

2. Description of the Background

Many products, such as cellular and PCS band telephones, require circuit devices, such as filters, directional couplers, power dividers, amplifiers, microwave mixers, and microwave fuses. Many new product designs require that the devices be smaller, less expensive, and perform to higher specifications than previously required, and it is increasingly difficult to obtain the desired performance from existing device designs. Lowpass filters will be discussed as an example of the difficulties faced with the prior art, although other types of devices may also benefit from the present invention. Lowpass filters pass signals below a predetermined cutoff frequency, and attenuate signals above the predetermined cutoff frequency. The attenuation of signals occurs in what is known as a stopband. Ideally, the stopband extends from the cutoff frequency to an infinite frequency. In practice, however, the stopband will end at some finite frequency above the cutoff frequency. The frequency range between the cutoff frequency and a point where the filter no longer meets rejection or attenuation requirements is known as the stopband width.

Present specifications for cellular and PCS band telephones require lowpass filter stopbands to be maintained up to about 12.5 GHz. Some prior art lowpass filter designs cannot be cost-effectively manufactured to those specifications, and other designs have undesirable characteristics. For example, traditional combline filters are bandpass filters and some higher frequency signals may pass through the filter with little loss because of higher order modes and harmonic multiples of the original passband. Most narrow band bandpass filters have stopbands that hold to slightly more than three times the center frequency of the passband. Wide band filters may hold to about five times the center frequency. One or more lowpass filters may be used in combination with a bandpass filter to increase stopband width, and such lowpass filters are usually referred to as "clean-up" lowpass filters. Although cascades of clean-up filters may be used to increase a stopband width to higher frequencies, clean-up filters do have parasitic passbands above their stopband.

Other alternatives include lumped element lowpass filters, but they are expensive, due in part to expensive substrate material and labor intensive assembly. Stripline lowpass filters require relatively expensive substrate material above and below the circuit, and grounding on both sides of the filter is critical. Furthermore, dielectric loading of inductive elements degrades the stopband width. Micro-stripline lowpass filters require expensive substrate material below the circuit and may have a nominally better stopband relative to stripline filters. However, dielectric loading of inductive elements reduce the high/low impedance ratio, which reduces performance. Modified micro-stripline lowpass filters may provide higher inductor impedance, but requires increased manual assembly and machining of parts, thereby increasing costs. Coaxial lowpass filters, also known as "bead and wire", generally provide the best lowpass filter performance. However, coaxial lowpass filters require machining and/or manual assembly, thereby increasing the cost of the device. Furthermore, the impedance ratio is limited by the power handling capability of the device to prevent inductor fusing.

Accordingly, there is a need for a new type of device that is inexpensive, easy to assemble, and that has good performance to better meet the demands of new and old technologies.

BRIEF SUMMARY OF THE INVENTION

The present invention is directed to a device including a flexible circuit disposed within a conductive tube. The circuit may include a flexible substrate and one or more circuit elements. The circuit may have circuit elements on one or both sides, and the substrate may be multi-layered. The tube may have any one of many cross-sectional shapes, including circular, oval, elliptical, square, and rectangular. The present invention also includes a method of forming a device. The method includes providing a circuit, bending the circuit on a mandrel, inserting the circuit and the mandrel into a tube, and removing the mandrel.

The present invention solves problems experienced with the prior art because it is inexpensive to manufacture and offers good performance characteristics. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein:

FIG. 26 is a side plan view of a device formed with the circuit illustrated in FIG. 25 and tuned with a dielectric;

FIG. 27 is a cross-sectional view of a device that may be tuned by adjusting shunt capacitance of the device 10;

FIG. 28 is a cross-sectional view of a device including the circuit illustrated in FIG. 24, a tube having openings corresponding to openings in the circuit 12, and a tuning screw fastened to the tube with an adhesive;

FIG. 29 is a side plan view of a device that may be tuned by adjusting the impedance of inductors in the circuit.

DETAILED DESCRIPTION OF THE INVENTION

Figure 1:
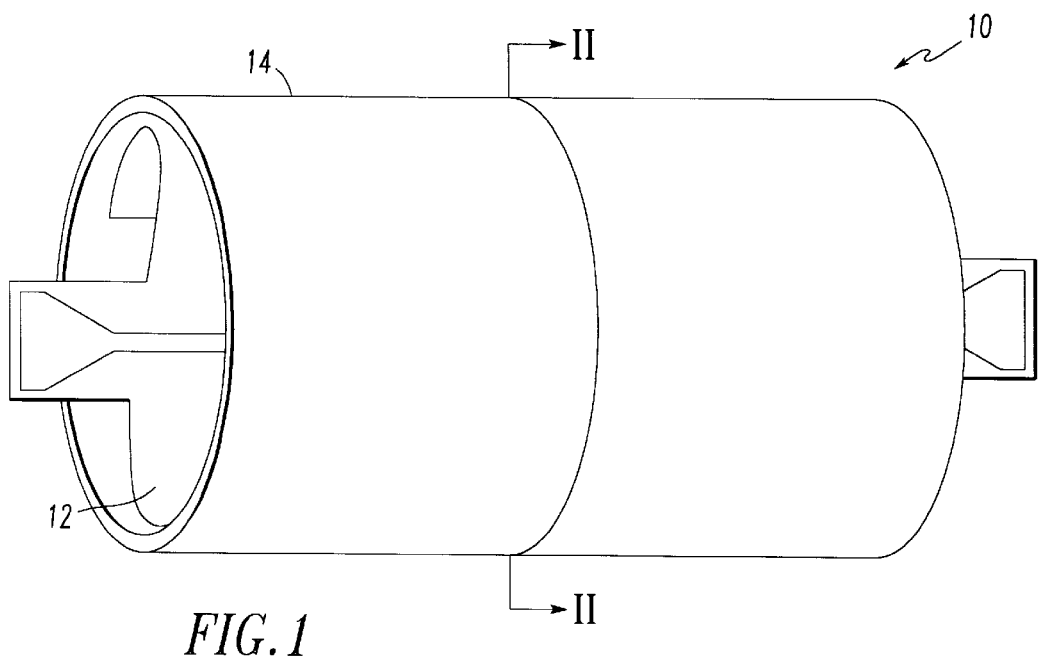
FIG. 1 is a perspective view of a device constructed in accordance with the present invention and including a tube and a circuit.

FIG. 1 is a perspective view of a device 10 constructed in accordance with the present invention. The device 10 includes a flexible circuit 12 disposed within an electrically conductive tube 14. The flexible circuit 12 may include protruding portions 15a, 15b extending from the tube 14. The device 10 may be, for example, a filter, a directional coupler, a power divider, an amplifier, including a low power amplifier and a low noise amplifier, a mixer, and a fuse. The present invention is particularly applicable to microwave devices, such as microwave filters, microwave mixers, and microwave fuses.

Figure 2:
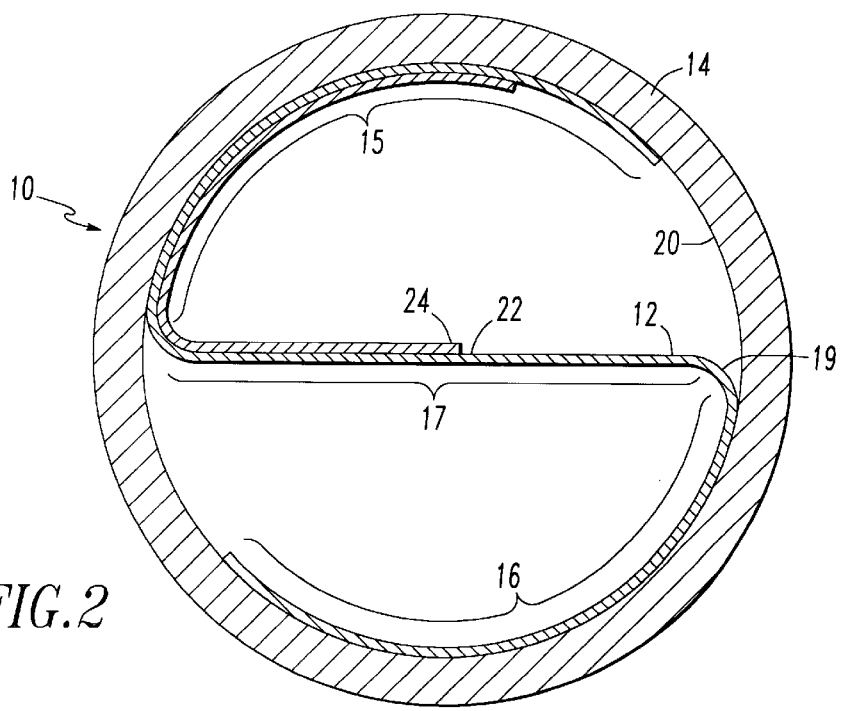
FIG. 2 is a cross-sectional view along line II—II of the device illustrated of FIG. 1.

FIG. 2 is a cross-sectional view along line II—II of the device 10 illustrated in FIG. 1. The circuit 12 is bent and in tension engagement with the tube 14. In the embodiment shown, the circuit 12 has two bent portions 15, 16 connected by a straight center portion 17, giving the circuit 12 an "S"-shaped cross-sectional shape. The bent portions 15, 16 include sharply bent portions 18, 19, respectively, that act as cantilevered springs to counter act each other, keep the straight portion 17 in tension, and secure the circuit 12 within the tube 14. The friction between the bent portions 15, 16 of the circuit 12 and an inner surface 20 of the tube 14 is sufficient to secure the circuit 12 within the tube 14, although the circuit 12 may tend to rotate clockwise and counter-clockwise over large temperature variations as may be predicted by the linear coefficient of thermal expansion. The bent portions 15, 16 may also be joined parallel to the inner portion 20 of the tube 14, such as with a low loss contact adhesive.

Figure 3:
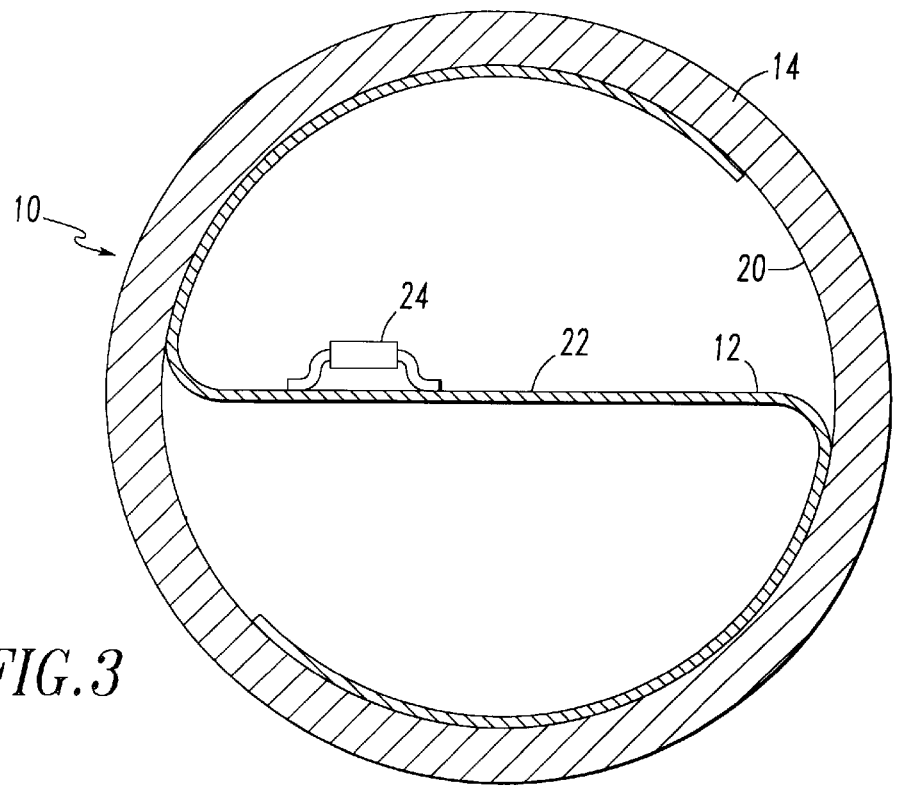
FIG. 3 is a cross-sectional view of a device with a circuit including a circuit element in the form of a discrete component.
Figure 4:
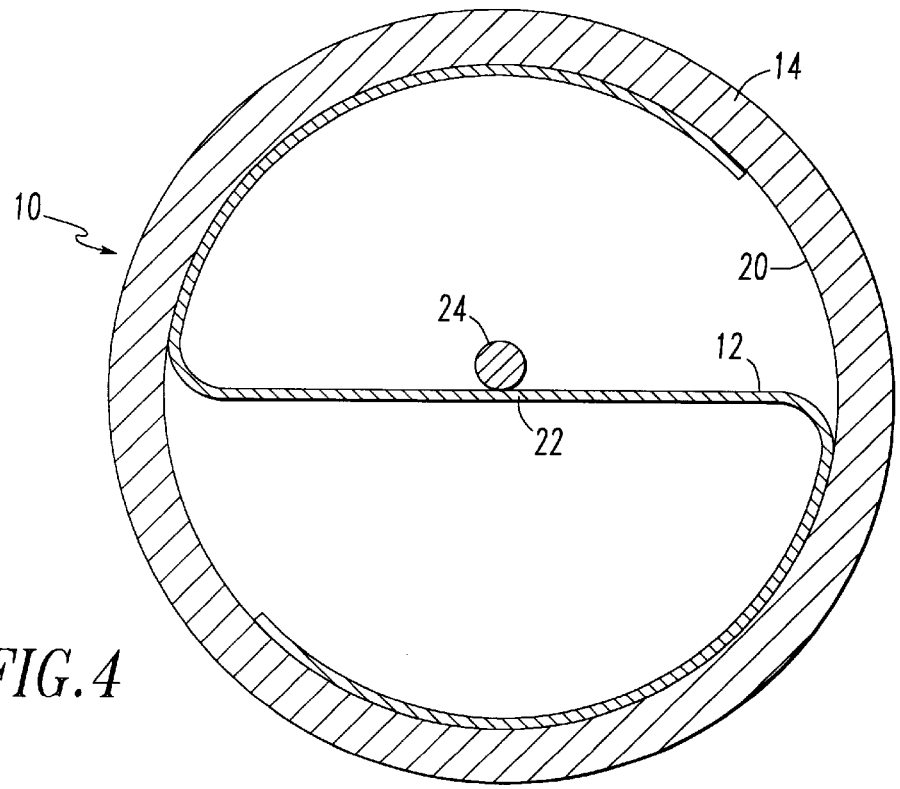
FIG. 4 is a cross-sectional view of a device with a circuit including a circuit element in the form of a wire used as a central conductor.
Figure 5:
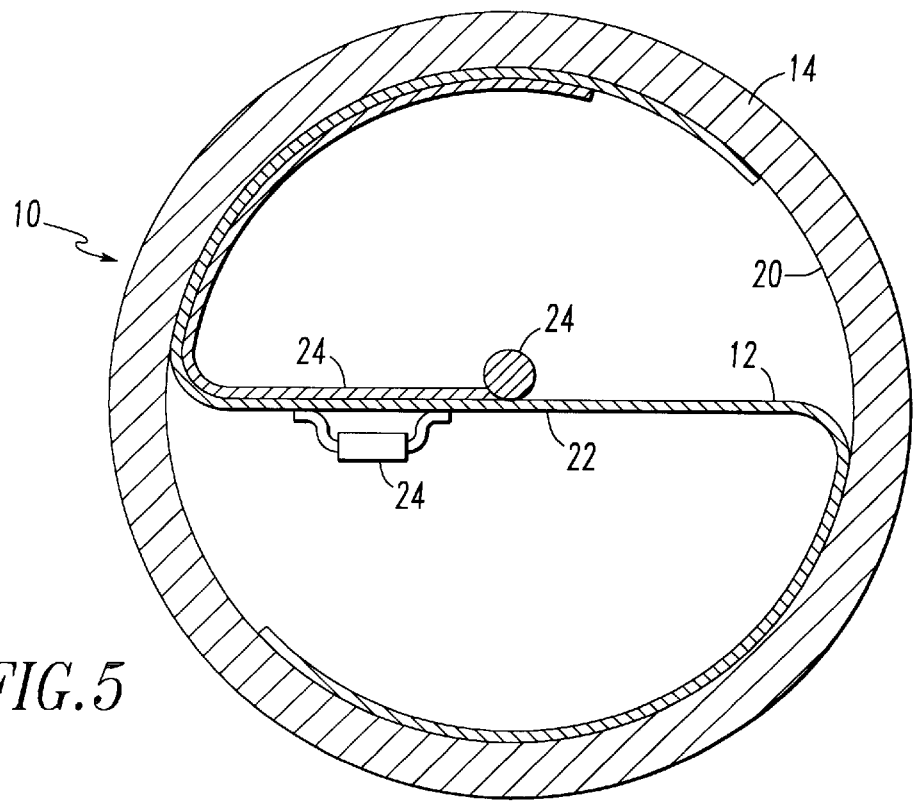
FIG. 5 is a cross-sectional view of a device with a circuit having circuit elements on both sides.
Figure 6:
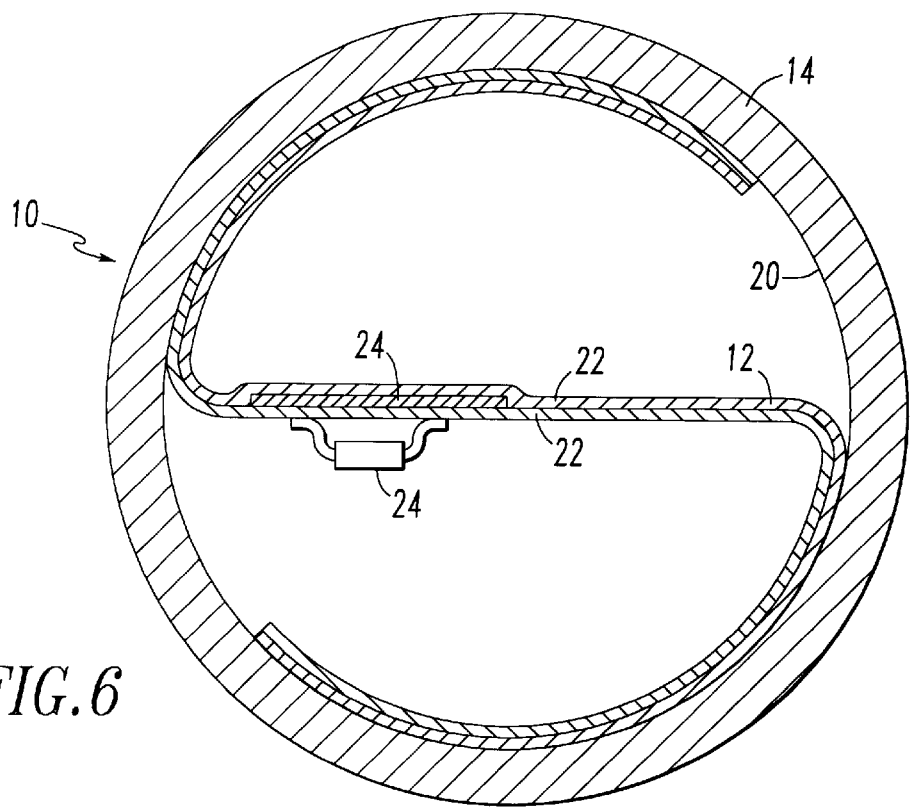
FIG. 6 is a cross-sectional view of a device with a circuit that is multi-layered.

The circuit 12 includes a flexible substrate 22 and circuit elements 24. The circuit elements 24 may be printed on the substrate 22, as illustrated in FIG. 2, and may also be formed from discrete components connected to the substrate 22, as illustrated in FIG. 3. Discrete components may be connected to the substrate 22 with surface mount technology, including solder and conductive adhesives. Many types of circuit elements 24 may be part of the circuit 12, including inductors, capacitors, resistors, diodes, and transistors. The circuit elements 24 may also include integrated circuits, including processors and application specific integrated circuits. Furthermore, although printed circuit elements 24 may be flexible, the circuit elements 24 do not necessarily have to be flexible to be used with the present invention. For example, rigid circuit elements 24, such as ceramic encapsulated and plastic encapsulated integrated circuits, may be mounted on the straight portion 17 of the substrate 22. The circuit elements 24 may also include heavier conductors, such as wires, if performance characteristics of printed circuit elements are not desirable. For example, wire conductors may be used in place of printed conductors if the circuit 12 will be subjected to high current loads that are not suitable for printed conductors. FIG. 4 illustrates a circuit element 24 in the form of a wire used as a central conductor. The circuit 12 may have circuit elements 24 on one side, as illustrated in FIGS. 2–4, and on both sides, as illustrated in FIG. 5. The circuit 12 may also be multilayered, as illustrated in FIG. 6, with components and circuit elements on none, one, or both sides of each layer, and between layers.

One advantage of the embodiment illustrated in FIGS. 1–6 is that the center portion 17 of the circuit 12 remains relatively flat and occupies the center of the tube 14 along a longitudinal axis of the tube 14. As a result, the present invention makes it easy to place one or more circuit elements 24 along the longitudinal center of the tube 14, as is often desirable when constructing signal filters.

Another advantage is that a printed conductor in the center of a round tube 14 behaves like a suspended substrate circuit. Suspended substrate circuits perform well in filter applications because there is little dielectric effect, resulting in low through line losses and high line impedance, even when using conventional flexible circuit substrate materials that typically have poor electrical characteristics at high, such as microwave, frequencies.

The circuit 12 may be formed with conventional flexible circuit techniques and may include a substrate 22 constructed from materials such as polyimide, polyester, aramid paper, polyetherimide, polyetherether ketone, polysulfone, polyphenylene sulfone, polyethersulphone, and fluorocarbon films. The substrate 22 may also be a composite formed from flexible films reinforced by rigid fibers, such as a glass-polyester laminate.

Conductors on the circuit 12 may be conductive inks, metal foils, and wires. Conductive inks may be formed, for example, from polymer binders and electrically conductive particles, including carbon, copper, and silver. Metal foils and wires may be formed from copper, silver, silver-plated copper, gold-plated copper, aluminum, gold, stainless steel, beryllium-copper, phosphor-bronze, copper-nickel, and nickel-chromium. The choice of conductors will typically depend on performance and cost considerations. Conductors may be printed onto the circuit, such as through electrodeposition, may be roll annealed onto the circuit 12, and may be deposited and then etched with conventional etching techniques.

The tube 14 is illustrated as having a circular cross-sectional shape, but it may also be of other shapes. For example, the tube 14 may have an oval cross-sectional shape, an elliptical cross-sectional shape, a rectangular cross-sectional shape, a square cross-sectional shape, and irregular cross-sectional shapes. The tube 14 is electrically conductive and may be constructed from metals, including aluminum, brass, and copper, as well as metalized non-metal materials, including carbon and carbon-fiber composites.

Figure 7:
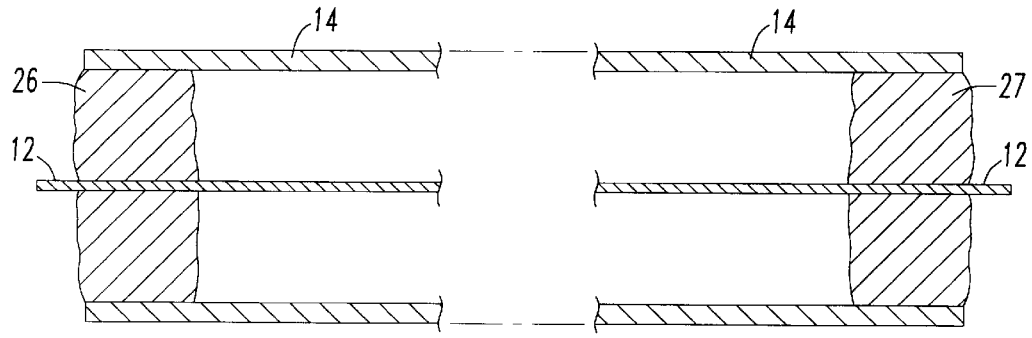
FIG. 7 is a cross-sectional view of a device having enclosures formed from an amorphous material at the ends of the tube.
Figure 8:
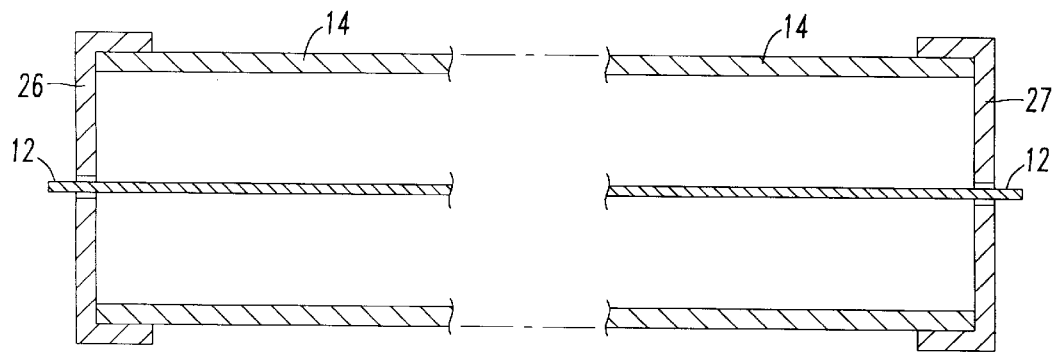
FIG. 8 is a cross-sectional view of a device having enclosures formed from stoppers with openings through which the circuit extends.
Figure 9:
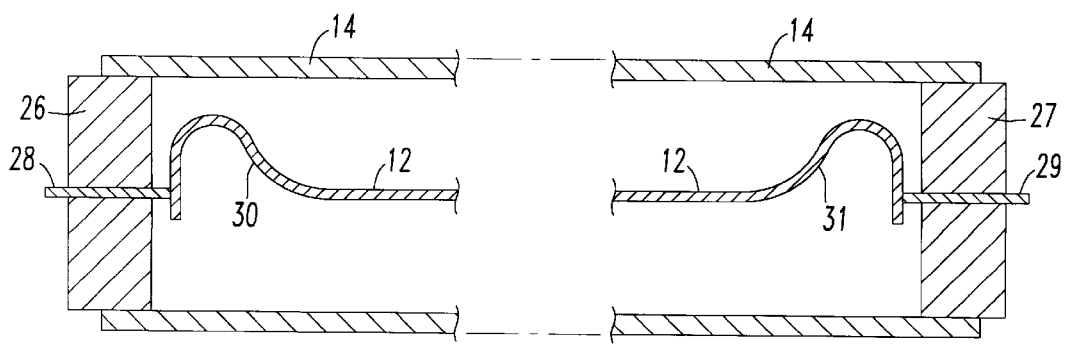
FIG. 9 is a cross-sectional view of a device having enclosures formed from a dielectric material and conductors extending therethrough.

FIGS. 7–9 are cross-sectional views of a devices 10 having enclosures 26, 27 at the ends of the tube 14. The enclosures 26, 27 secure the circuit 12 within the tube 14, and protect the circuit 12 from damage and performance degradation, such as may be caused by humidity and particulate matter. The circuit 12 may extend past the enclosures 26, 27 for connection to an external circuit. Connections to the circuit 12 may be made using conventional surface mount techniques. The enclosures 26, 27 may be formed from many materials, such as room temperature vulcanization material, plastic, ceramic, glass, and metal. If the enclosures 26, 27 are made from a conductor, the circuit 12 may be electrically insulated from the enclosures 26, 27, such as by a dielectric on the surface of the circuit 12. The enclosures 26, 27 may have an amorphous form or a more rigid form, and may seal the tube 14 at the inner surface 20 and/or from the outside of the tube 14. FIG. 7 illustrates enclosures 26, 27 formed from a material, such as room temperature vulcanization material, placed within the tube 14. FIG. 8 is a cross-sectional view of a device 10 with enclosures 26, 27 in the form of stoppers having openings through which the circuit 12 extends. The enclosures 26, 27 may be made to have openings that fit tightly around the circuit 12, so as to more effectively keep humidity and particulate matter out of the device 10. FIG. 9 is a cross-sectional view of a device 10 having enclosures 26, 27 in the form of a dielectric material and conductors 28, 19 extending therethrough. The enclosures 26, 27 may be, for example, a metal pin/glass feedthrough. In that embodiment, the conductors 28, 29 may be connected to the circuit 12 before the enclosures 26, 27 are inserted into the tube 14. End portions of the circuit 12 may bend and form service loops 30, 31 when the enclosures 26, 27 are inserted into the tube 14. The service loops 30, 31 are formed because the circuit 12 is longer than the usable internal length of the tube 14. That excess length of the circuit 12 facilitates making connections to the conductors 28, 29 to the circuit 12 prior to inserting the enclosures 26, 27 in the tube 14. All of the excess length may also be taken up by a single service loop 30.

Figure 10:
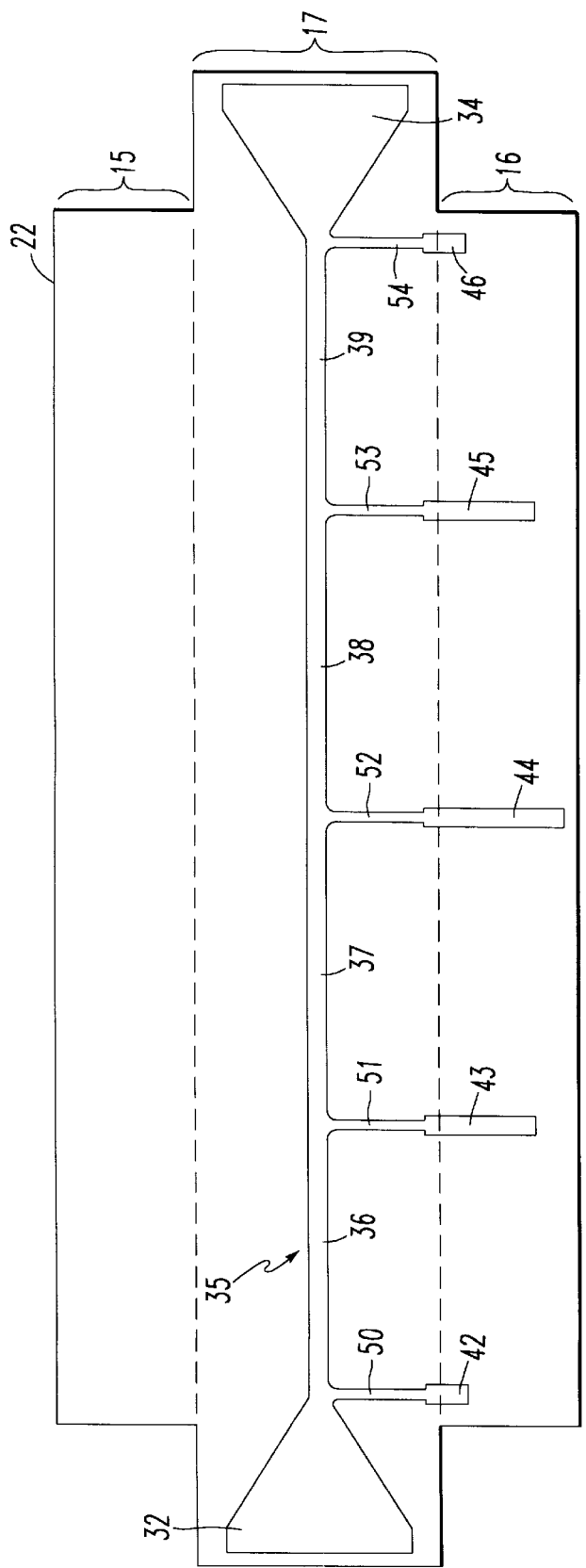
FIG. 10 is a top plan view of the circuit illustrated in FIG. 1.

FIG. 10 is a plan view of the circuit 12 removed from the tube 14. The circuit 12 illustrated in FIG. 10, when combined with the tube 14 illustrated in FIG. 1, forms a microwave lowpass filter. Other circuit 12 designs may be used to form other types of filters, such as bandpass filters, bandstop filters, and highpass filters. The microwave lowpass filter described in detail hereinbelow is illustrative of only one of many types of devices 10 that may embody the present invention.

The circuit 12 may have one or more protruding portions 15a, at its ends so that, when inserted into the tube 14 as illustrated in FIG. 1, the protruding portions 15a, 15b extend out of the tube 14 to facilitate connection to the circuit 12. Unlike a comparable bead-and-wire lowpass filter, all of the circuit elements in the circuit 12 may be printed onto the substrate 22. As a result, the circuit 12 may be constructed without manual assembly and without the machining of parts, thereby reducing manufacturing costs. It has been found that a trace thickness of 0.7 mils and a substrate thickness of one mil can be used to produce an operational circuit 12 such as that illustrated in FIG. 10.

The circuit 12 illustrated in FIG. 10 includes first and second connectors 32, 34 to facilitate electrical connection to the circuit 12. The circuit 12 may also have more or less than two connections. For example, a single protruding portion may be used to carry signals both into and out of the circuit 12, such as on a single shared signal line, or on two or more signal lines on the same protruding portion. The circuit 12 also includes circuit elements in the form of printed conductors. A circuit element in the form of a central conductor 35 connects the first and second connectors 32, 34. The central conductor 35 may be formed as a single conductor, or as a series of individual conductors 36, 37, 38, 39 connected together. Regardless of how is formed, the central conductor 35 will form a series of inductors. Inductors may be formed from short sections of a high impedance conductor, such as a relatively thin conductor surrounded by a dielectric of air. The conductor may be located in the center of the tube 14. Additional conductors 42, 43, 44, 45, 46 will form capacitors. Capacitors may be formed from low impedance conductors 42–46 that extend onto a portion 16 of the circuit 12 that is parallel to and separated from the inner surface 20 of the tube 14 by the substrate 22 when the circuit 12 is disposed inside the tube 14.

There are two portions 15, 16 of the circuit 12 that, when inserted in the tube 14 as illustrated in FIG. 1, are parallel to the inner surface 20 of the tube 14. The side of the circuit 12 illustrated in FIG. 10 has one portion 15 that faces and is in contact with the inner surface 20 of the tube 14, and one portion 16 faces away from and is separated from the inner surface 20 by the substrate 22. Capacitors may be formed by placing conductors on the portion 16 separated from the inner surface 20 by the substrate 22, as is done with conductors 42–46. Connections to ground may be made by placing conductors on the portion 15 in contact with the inner surface 20, although no such connections are needed in the embodiment illustrated in FIG. 10. A low loss contact adhesive or gel, or other material such as solder and solder paste, may also be used with conductors on the circuit portion 15 in contact with the inner surface 20 to form a better electrical contact to the inner surface 20.

Conductors 50, 51, 52, 53, 54 connect the conductors 36–39 that are inductors to the conductors 42–46 that will form capacitors. Those conductors 50–54 tend to act as parasitic inductors and tend to change the performance of the device 10 from pure Tchebycheff to pseudo-elliptic. As a result, the device 10 produces a sharper skirt than a comparable "bead and wire" lowpass filter with the same number of circuit elements.

Figure 11:
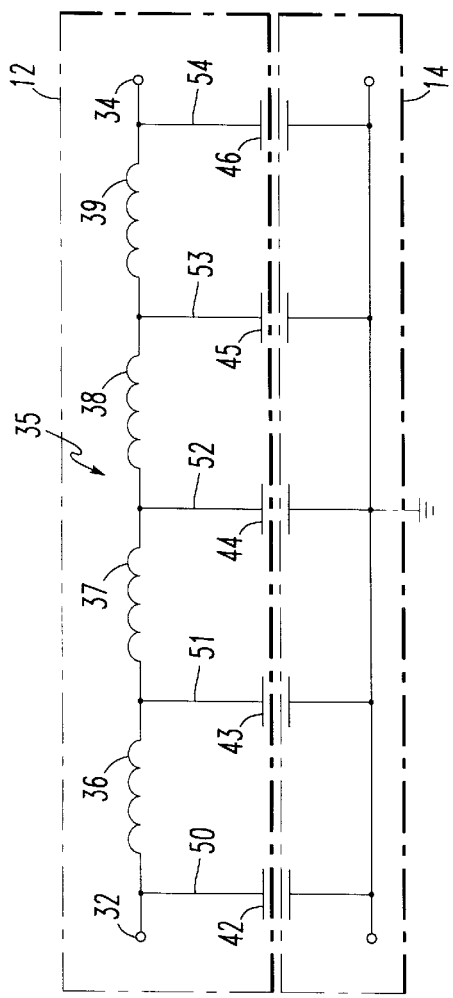
FIG. 11 is a schematic of the circuit illustrated in FIG. 10.

FIG. 11 is a schematic of the device 10 including the circuit 12 illustrated in FIG. 10. FIG. 11 illustrates the connectors 32, 34, the conductor or conductors 36–39 forming inductors, and the capacitors formed from conductors 42–46 and the tube 14. The tube may be grounded, as illustrated in broken lines. The present invention may be embodied in other circuit designs, including designs having more and less connectors 32, 34, more and less inductors, more and less capacitors, and other circuit elements.

Figure 12:
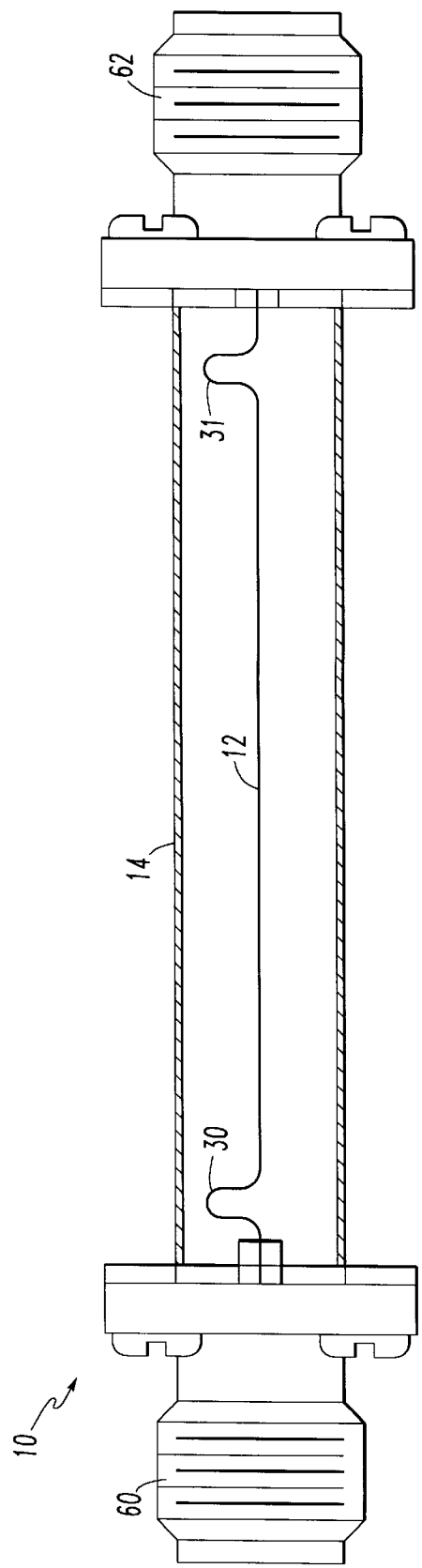
FIG. 12 is a combination side plan view and cross-sectional view of the device illustrated in FIG. 1 and including SMA connectors.

FIG. 12 is a combination side plan view and cross-sectional view of a device 10 constructed in accordance with the present invention and including SMA connectors 60, 62 attached to ends of the tube 14. The SMA connectors 60, 62 may be electrically connected to the circuit 12 via circuit connectors 32, 34 (illustrated in FIG. 10) with, for example, wires, and may be electrically connected directly to the patterned circuit portion of the flexible circuit.

Figure 13:
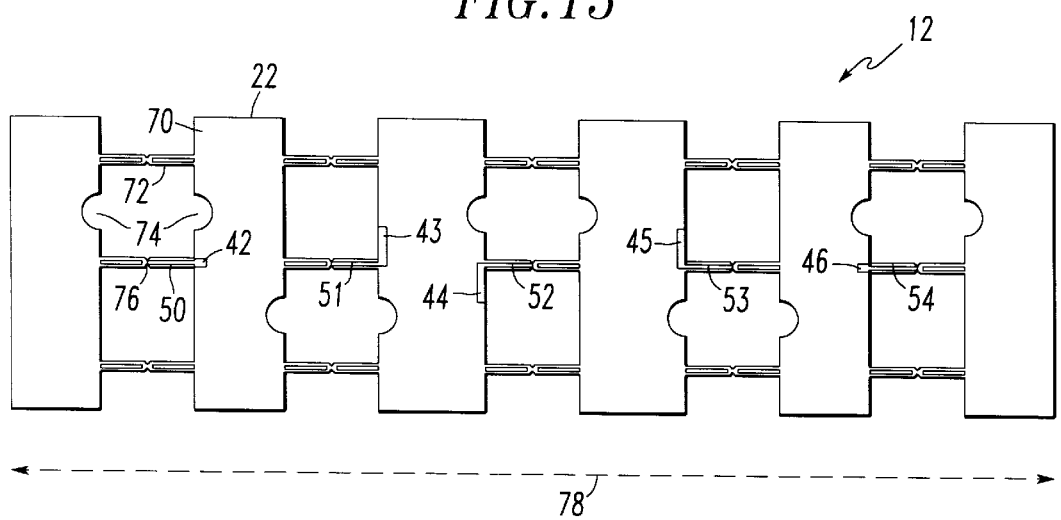
FIG. 13 is a top plan view of a circuit constructed in accordance with the present invention.

FIG. 13 is a top plan view of another circuit 12 constructed in accordance with the present invention. The circuit 12 includes a substrate 22 having a number of rectangular sections referred to herein as "body sections" 70, connected to each other by sections of the substrate 22 referred to herein as "fingers" 72. The substrate 22, including the body sections 70 and the fingers 72, may be formed as a single piece that is molded, stamped, cut, or otherwise formed in a desired shape. The number of body sections 70 and fingers 72 may vary, depending on the device, performance criteria, and other factors.

The body sections 70 may carry different types of circuit elements, as discussed hereinabove with respect to FIGS. 1–12. The embodiment illustrated in FIG. 13, when put in its final form and combined with a tube 14, is a microwave lowpass filter. The circuit 12 includes printed conductors 42–46 that will form capacitors when the device 10 is assembled. The body sections 70 may include a number of openings 74 that, when the circuit 12 is placed in its final form, provide access through the body sections 70 to the fingers 72. The fingers 72 are connected to the body sections 70 and carry conductors 50–54 for connecting the conductors 42–46 to a central conductor forming inductors 36–39. The fingers 72 may also include notches or scores 76 to promote bending of the fingers 72 at a predetermined location.

The circuit 12 illustrated in FIG. 13 is compressed along a horizontal axis 78. The fingers 70 bend at the notches 76 and also bend where the fingers 72 meet the body sections 70. Compression brings the body sections 70 together and the fingers 72 double over themselves and become vertical to a plane formed by the body sections 70.

Figure 14:
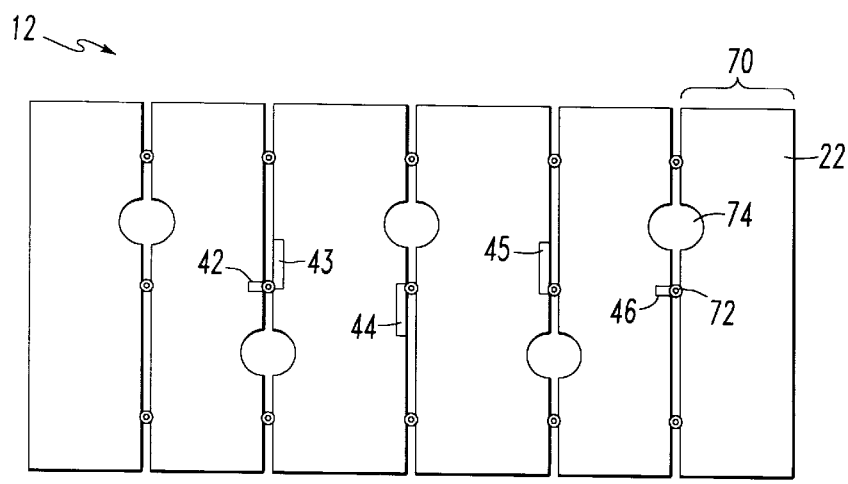
FIG. 14 is a top plan view after longitudinal compression of the circuit illustrated in FIG. 13.
Figure 15:
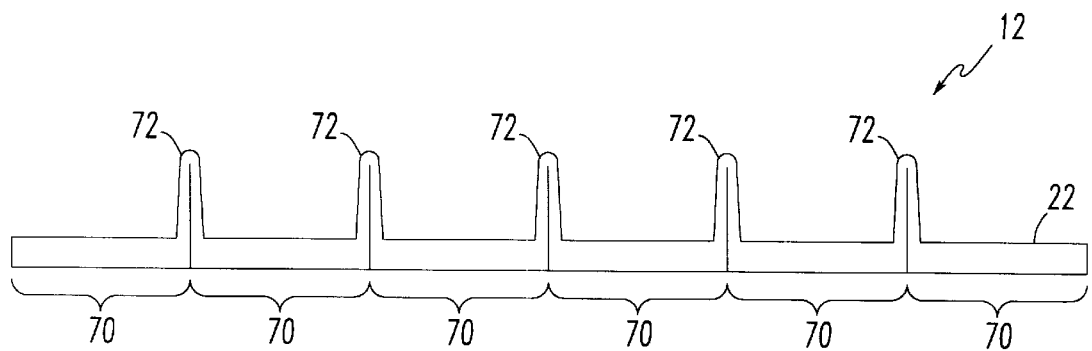
FIG. 15 is a front plan view after compression of the circuit illustrated in FIG. 13.

FIG. 14 is a top plan view of the circuit 12 illustrated in FIG. 13 after it is compressed. The openings 74 in the body portions 70 may be used to access the fingers 72 and a central conductor 35 (illustrated in FIG. 16) when the circuit 12 is rolled into a cylindrical shape prior to insertion in the tube 14 (also illustrated in FIG. 16). FIG. 15 is a front plan view of the circuit 12 illustrated in FIG. 10 after it is compressed.

Figure 16:
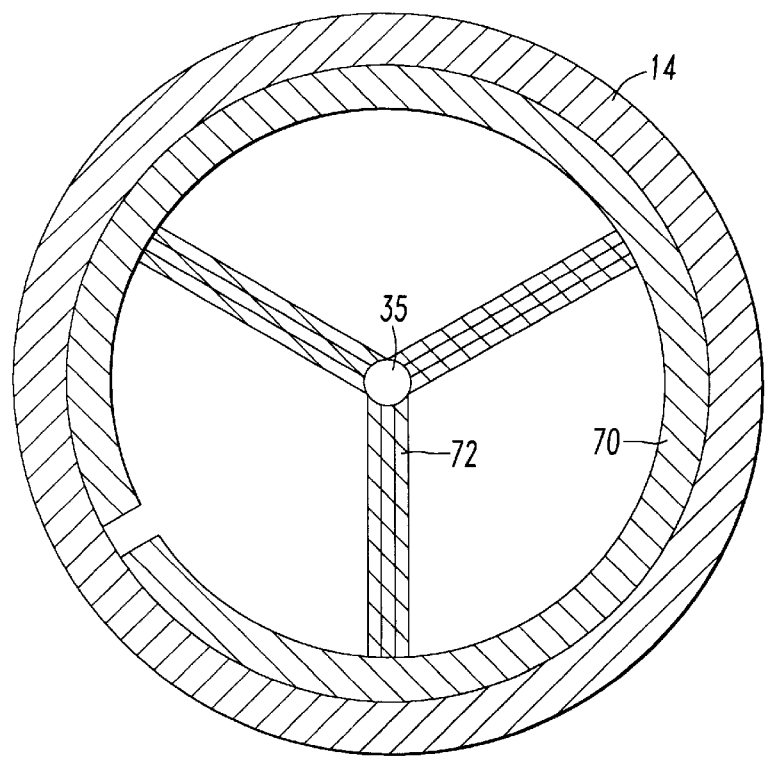
FIG. 16 is a cross-sectional view of a device with the circuit illustrated in FIG. 13 inserted in a tube.

FIG. 16 is a cross-sectional view of a device 10 formed by the circuit 12 illustrated in FIG. 13 disposed in a tube 14. The circuit 12 illustrated in FIG. 13 is compressed to the form illustrated in FIGS. 14 and 15, and then formed into a cylindrical shape by bending the circuit 12 around the longitudinal axis 78 (illustrated in FIG. 13) so that the fingers come together in the center and the body sections 70 form a wall of a cylinder. The fingers 72 are radial and connect the circuit 12 to a central conductor 35 centered in the tube 14 and traversing its length. The central conductor 35 may be a single piece or multiple pieces. The central conductor 35 is electrically connected to the fingers 72, such as with solder or a conductive adhesive. Access to the fingers 72 and the central conductor 35 is facilitated with the openings 74 (illustrated in FIG. 14) in the body portions 70 of the substrate 22.

Figure 17:
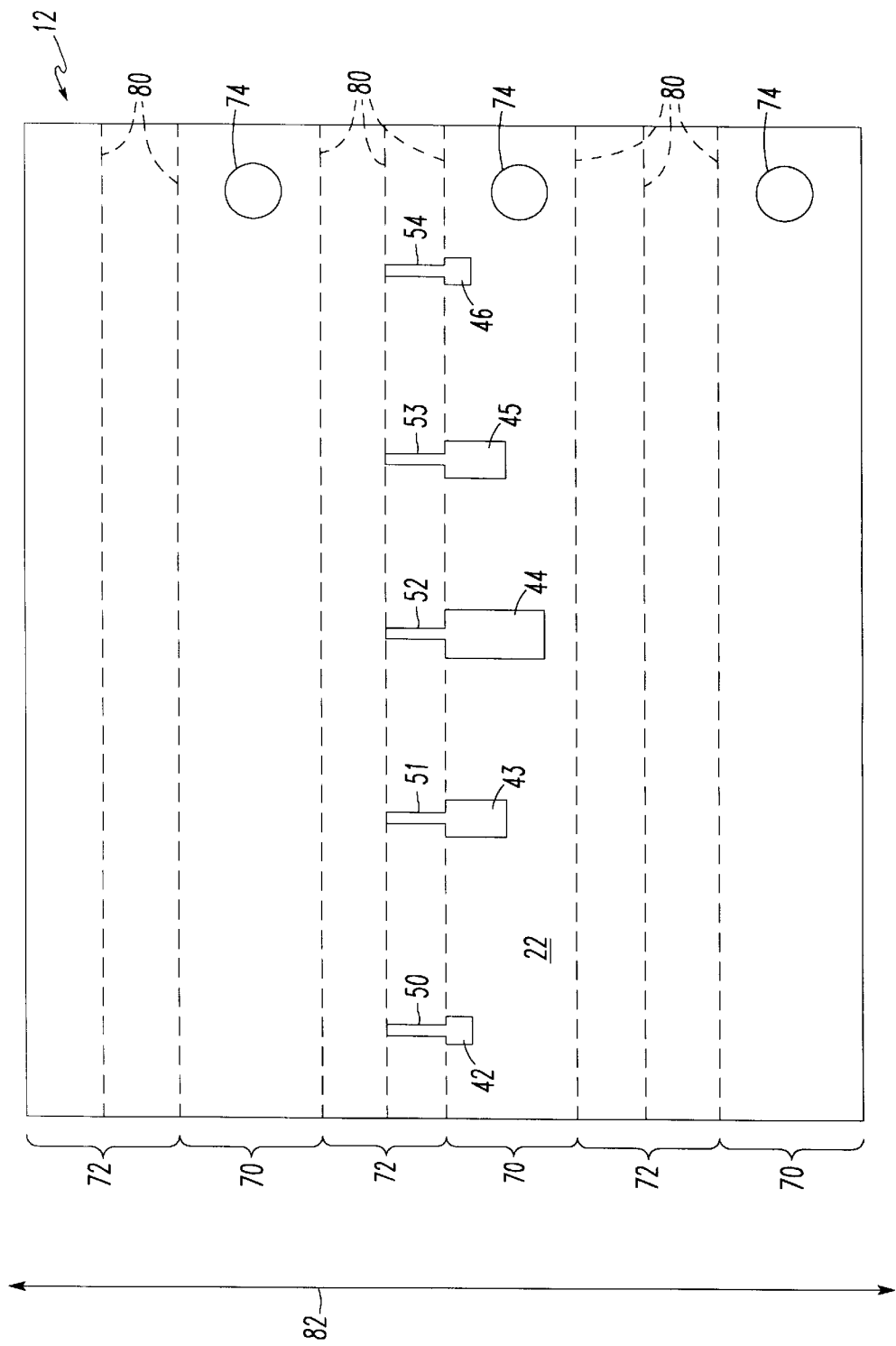
FIG. 17 is a top plan view of a circuit constructed in accordance with the present invention.
Figure 19:
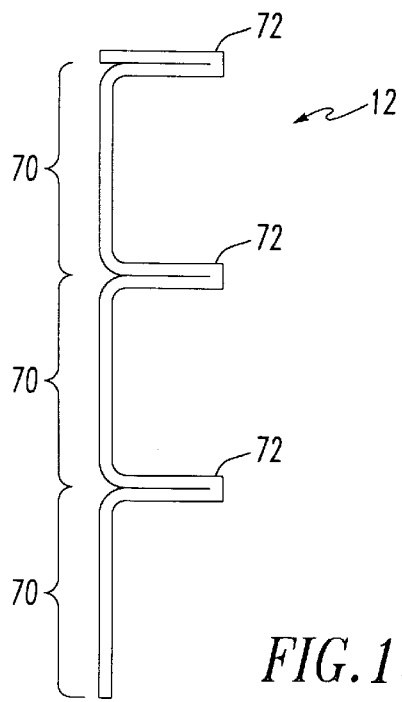
FIG. 19 is a cross sectional view along lines XIX—XIX of the circuit illustrated in FIG. 18.

FIG. 17 is a top plan view of another circuit 12 constructed in accordance with the present invention. The circuit 12 will form a microwave lowpass filter when combined with a tube 14. The circuit 14 includes a flexible substrate 22 and a number of circuit elements in the form of printed conductors 42–46 that will form capacitors. The circuit 12, of course, may include many different types and combinations of circuit elements, as discussed hereinabove. The circuit 12 may be divided into body sections 70 on which circuit elements may be formed, and other sections that will form fingers 72. Conductors 50–54 may be used to connect the circuit elements 42–46 to one or more inductors formed by a central conductor 35 (illustrated in FIG. 20). The circuit 12 may also include scores 80 to facilitate bending the circuit 12 at predetermined locations to form fingers 72, as illustrated in FIG. 19. The circuit 12 may include one or more openings 74 that may be used to pull the circuit 12 into the tube 14 with hooked wires extending through the tube 14. The circuit 12 is compressed along a transverse axis 82, causing the substrate 22 to bend at the scores 80 and to the form fingers 72 perpendicular to the body sections 70.

Figure 18:
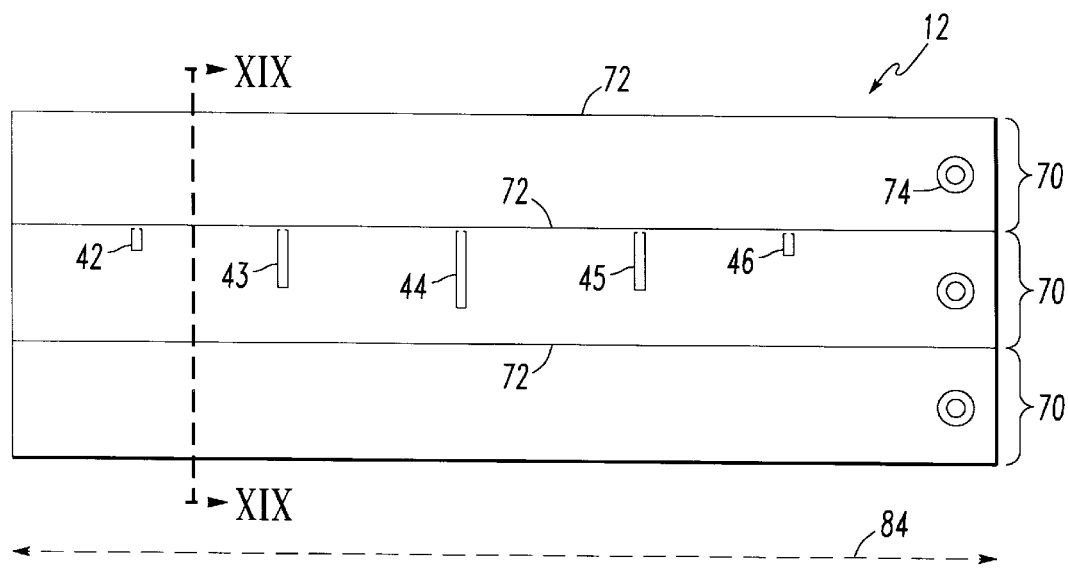
FIG. 18 is a top plan view of the circuit illustrated in FIG. 14 after it is compressed along its transverse axis.

FIG. 18 is a top plan view of the circuit 12 illustrated in FIG. 14 after compression. Unlike the embodiment illustrated in FIGS. 13–16, the fingers 72 extend along the length of the circuit 12.

Figure 20:
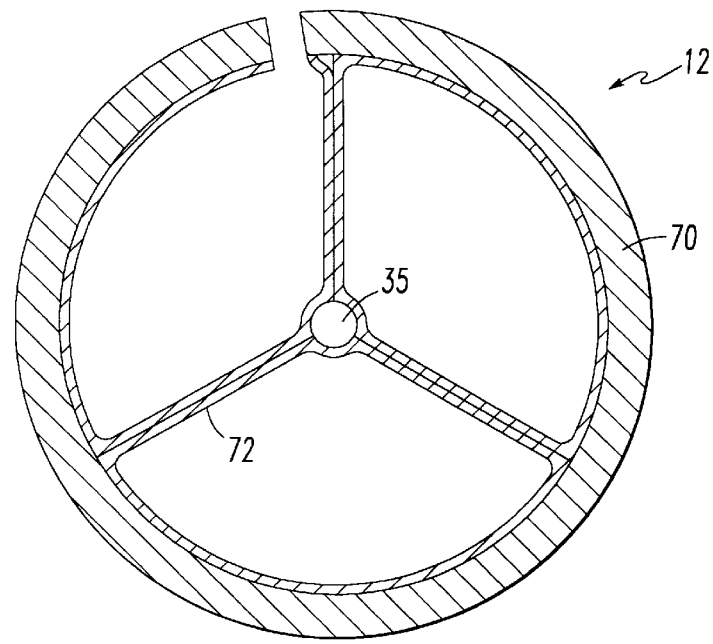
FIG. 20 is a cross-sectional view of the circuit rolled into a cylindrical shape.
Figure 21:
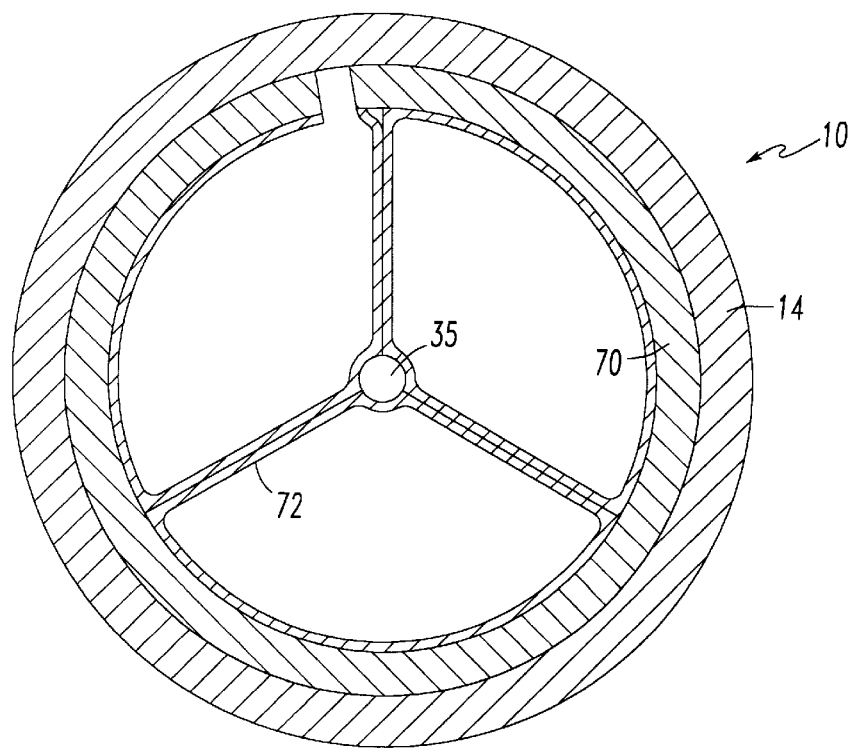
FIG. 21 is a cross-sectional view of a device with the circuit illustrated in FIGS. 18–20 inserted in a tube.

FIG. 19 is a cross sectional view along lines XIX—XIX of the circuit 12 illustrated in FIG. 18. The circuit 12 may be bent around a longitudinal axis 84 to form a cylindrical shape with the fingers 72 coming together in the center and body portions 70 forming a wall of a cylinder, as illustrated in FIG. 20. FIG. 20 is a cross-sectional view of the circuit rolled into a cylindrical shape with a central conductor 35 connected to the conductors 50–54 on one or more of the fingers 72. The central conductor 35 may be connected to only one of the fingers 72, such as the central finger. That connection is easily made when the circuit 12 is in the form illustrated in FIGS. 18 and 19, prior to forming the circuit 12 into a cylinder. FIG. 21 is a cross-sectional view of a device 10 including the circuit 12 illustrated in FIGS. 17–20 inserted in a tube 14.

Figure 22:
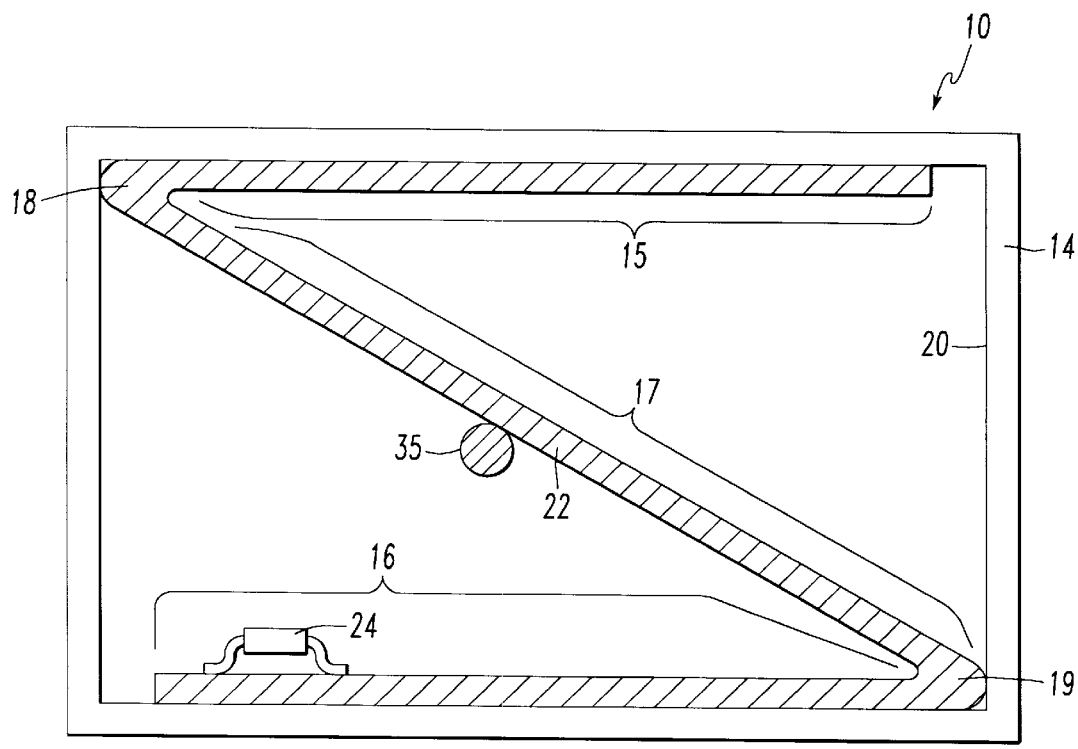
FIG. 22 illustrates a device including a rectangular tube.
Figure 23:
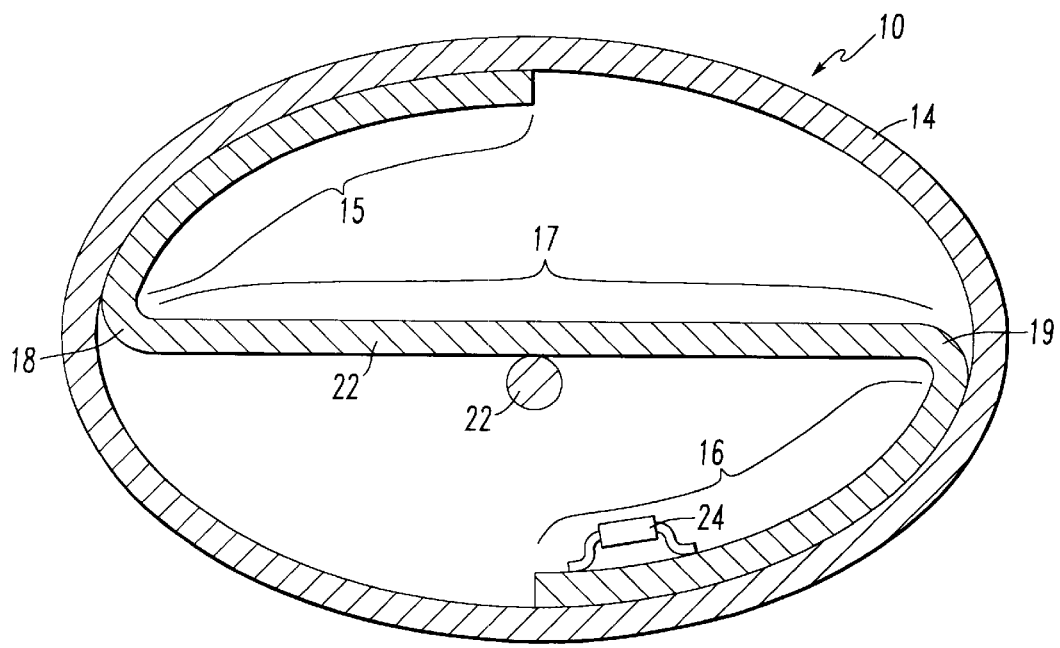
FIG. 23 illustrates a device including an elliptical tube.

FIG. 22 illustrates a rectangular tube 14 with an "Z"-shaped circuit disposed therein. The circuit includes bent portions 15, 16 in contact with the inner surface 20 of the tube 14, and a straight portion 17 through the center of the tube 14. That embodiment includes large bent portions 15, 16 and a large straight portion 17. The bent portions 15, 16 are relatively flat except for the cantilevered spring portions 18, 19, which are more sharply bent than in other embodiments, thereby giving a "Z"-shaped appearance rather than "S"-shaped. Circuit elements 24 may be connected to the portions 15, 16, 17. The tube 14 may be more or less square, depending on the characteristics required. Other variations are, of course, possible. For example, FIG. 23 illustrates an elliptical tube 14.

Figure 24:
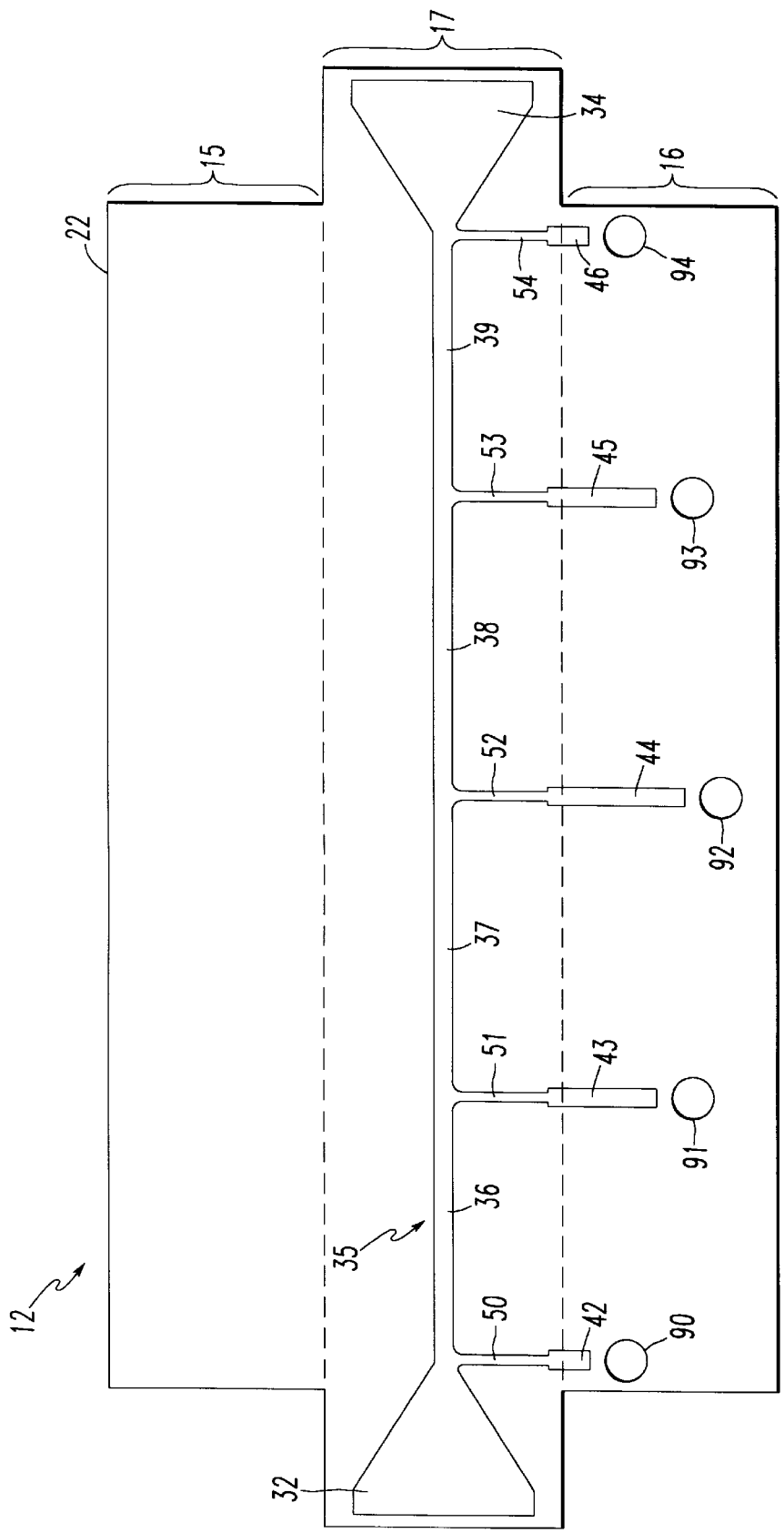
FIG. 24 is a top plan view of a circuit having openings therein that may be used to tune the device.
Figure 25:
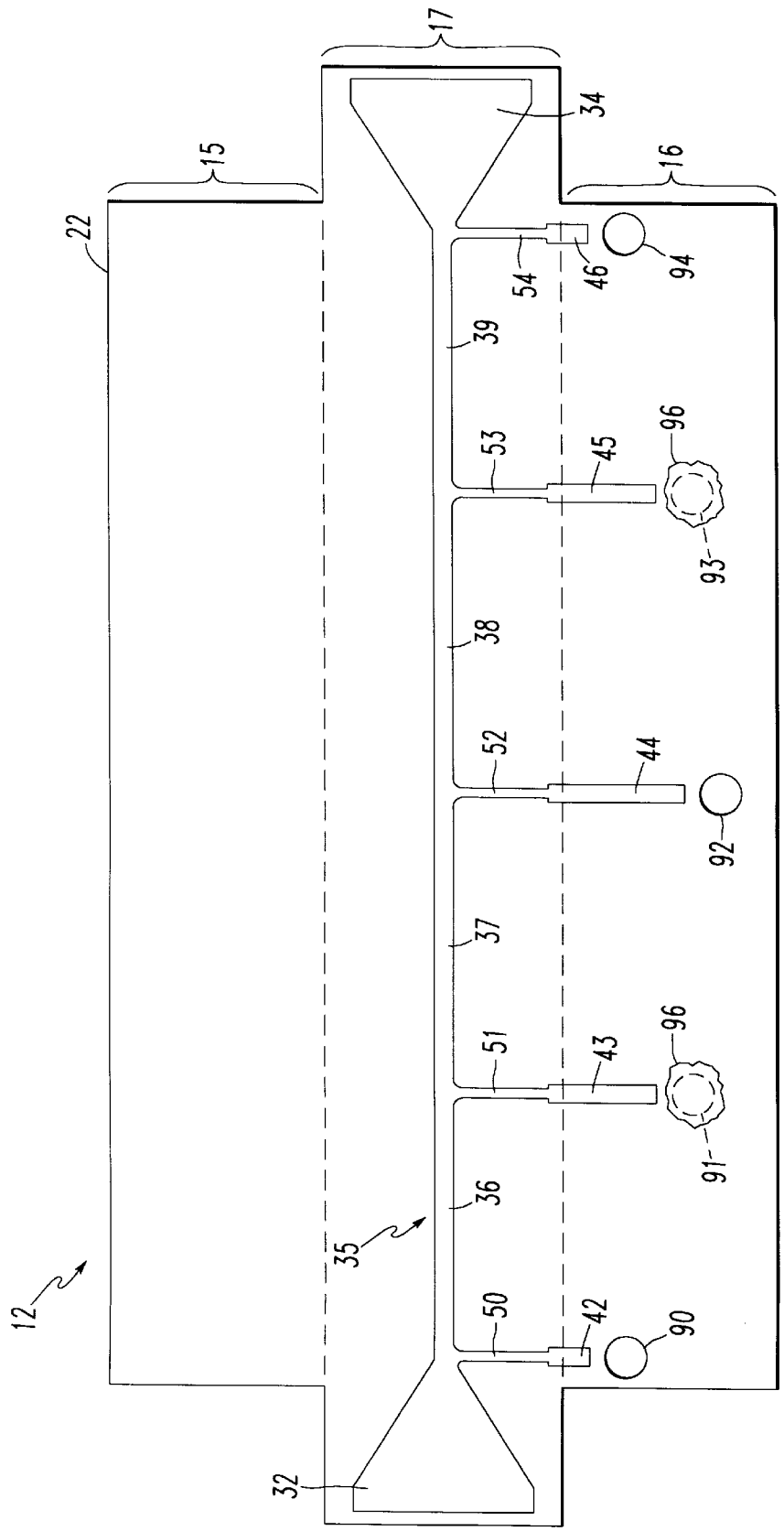
FIG. 25 is a top plan view of the circuit illustrated in FIG. 24 with a dielectric 96 in two of the openings.

The device 10 may also be tuned to enhance its performance. Tuning may be accomplished by altering the capacitance of capacitors and the impedance of the inductors. FIG. 24 is a top plan view of a circuit 12 having openings 90, 91, 92, 93, 94 therein near the ends of the circuit elements 42–46 used to form shunt capacitors. FIG. 25 is a top plan view of the circuit 12 illustrated in FIG. 24 with a dielectric 96, preferably a high dielectric constant material such as room temperature vulcanization material, in two of the openings 91, 94. The dielectric 96 may be place in one or more of the openings 90–94 to modify the shunt capacitance. In the illustrated embodiment, the dielectric 96 increases the shunt capacitance related to circuit elements 43, 46. The dielectric 96 may be placed in the openings 90–94 with a syringe. FIG. 26 is a side plan view of a device 10 formed with the circuit 12 illustrated in FIG. 25 and tuned with a dielectric 96.

FIG. 27 is a cross-sectional view of a device 10 that may be tuned by adjusting shunt capacitance of the device 10. The device 10 may include the circuit 12 illustrated in FIG. 24 and a tube 14 having openings 98 corresponding to the openings 90–94 in the circuit 12. One or more electrical conductors, such as tuning screws 100, may be placed through one or more of the openings 90–94 in the circuit 12 and through one or more corresponding openings 98 in the tube 14. The opening 98 in the tube 14 may be threaded so that the tuning screw 100 may be adjusted in the openings 90–94, 98. A locking nut 102 may be used to lock the tuning screw 100 in place once the device 10 is properly tuned. Alternatively, a electrical conductor may be placed within the openings and fastened, such as with solder or an adhesive. FIG. 28 is a cross-sectional view of a device 10 including the circuit 12 illustrated in FIG. 24, a tube 14 having openings 98 corresponding to the openings 90–94 in the circuit 12, and a tuning screw 100 fastened to the tube 14 with an adhesive 104. The adhesive 104 may be solder or a conductive epoxy.

FIG. 29 is a side plan view of a device 10 that may be tuned by adjusting the impedance of inductors in the circuit 12. The device 10 may be formed from the circuit 12 illustrated in FIG. 24, a tube 14 having one or more openings therein and having one or more tuning screws as described hereinabove with respect to FIGS. 27 and 28. A tuning screw 100 may be used to tune the device 10 by adjusting the impedance of inductors on the straight portion 17 of the circuit 12. The impedance of inductors on the straight portion 17 may be lowered because the tuning screw 100 will be a shunt capacitor, thereby increasing the shunt capacitance of the device and reducing the inductor impedance. Preferably, the opening 98 in the tube 14 is approximately above the straight portion 17 of the circuit 12 so that the tuning screw 100 is approximately perpendicular to the straight portion 17.

Figure 30:
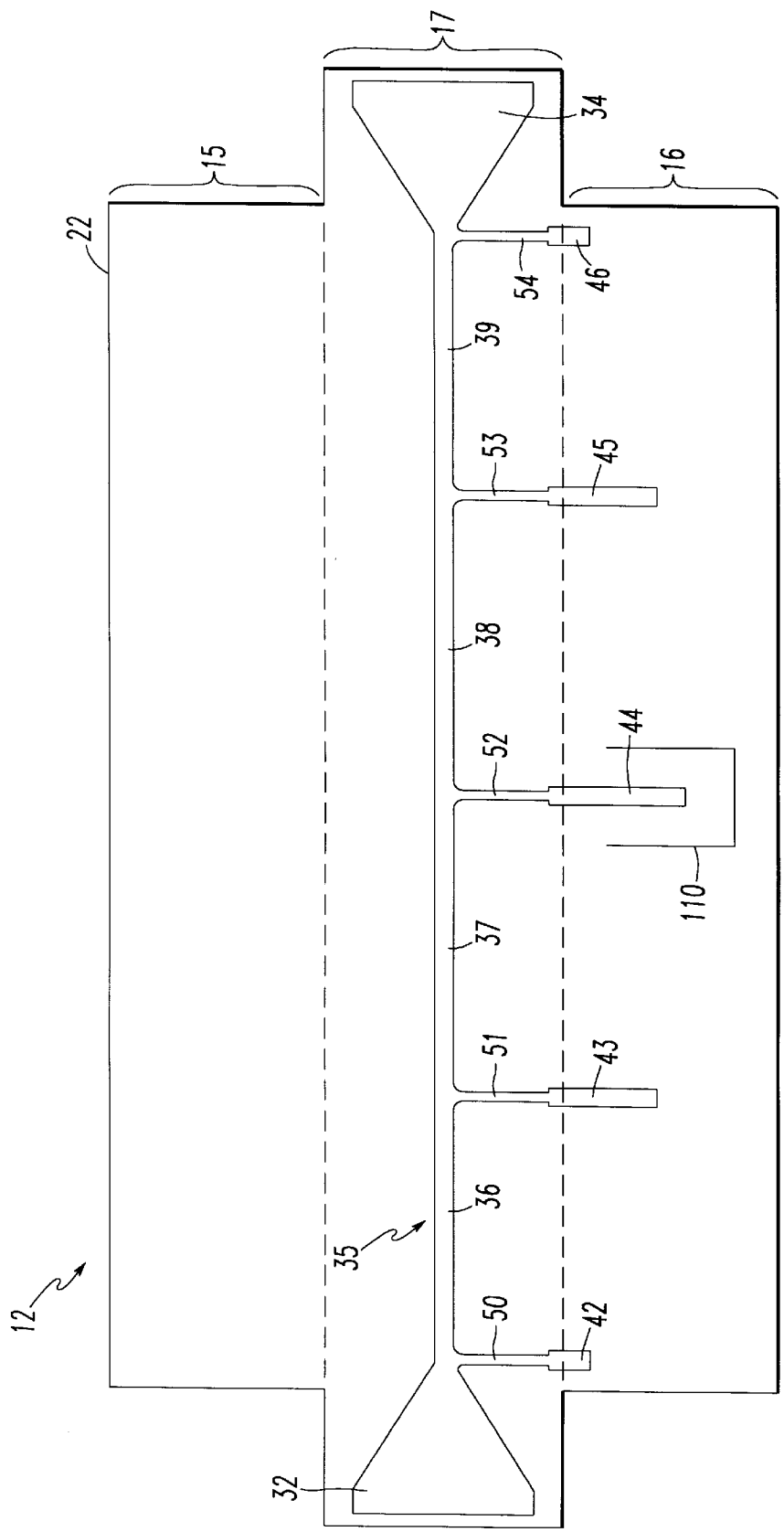
FIG. 30 is a top plan view of a circuit having a moveable circuit element.
Figure 31:
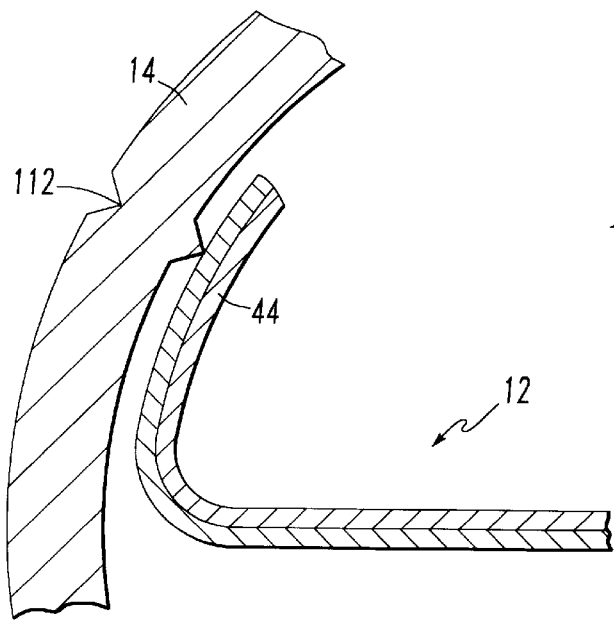
FIG. 31 is a partial cross-sectional view of a device including the circuit illustrated in FIG. 30.

FIG. 30 is a top plan view of a circuit 12 having a moveable circuit element 44, such as may be used to form a capacitor. The circuit element 44 may be on a portion of the substrate that is cut along line 110 so as to form a flap that is moveable relative to the rest of the circuit 12. FIG. 31 is a partial cross-sectional view of a device 10 including the circuit 12 illustrated in FIG. 30. The capacitance of a capacitor formed from circuit element 44 may be adjusted by moving the circuit element 44 relative to the tube 14. When some or all of the circuit element 44 is moved away from the tube 14, the capacitance decreases. A deformation 112, such as a dimple, may be placed in the tube 14 to form a partial gap between the circuit element 44 and the tube 14.

Figure 32:
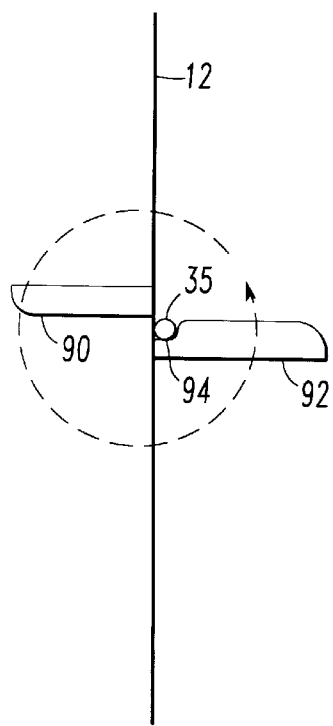
FIGS. 32–35 illustrate how a circuit 12 may be bent and placed within a tube 14.
Figure 33:
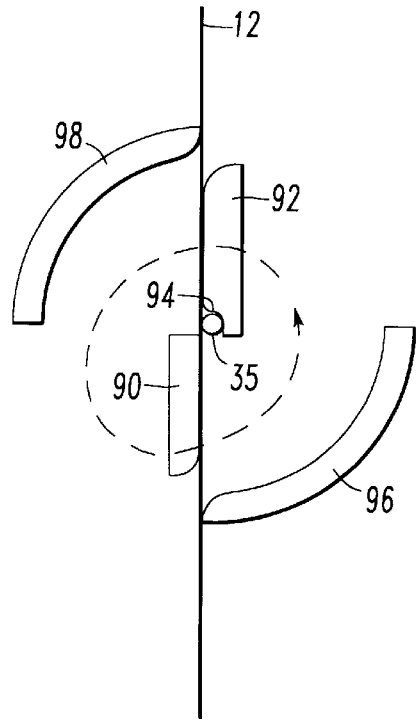
Figure 34:
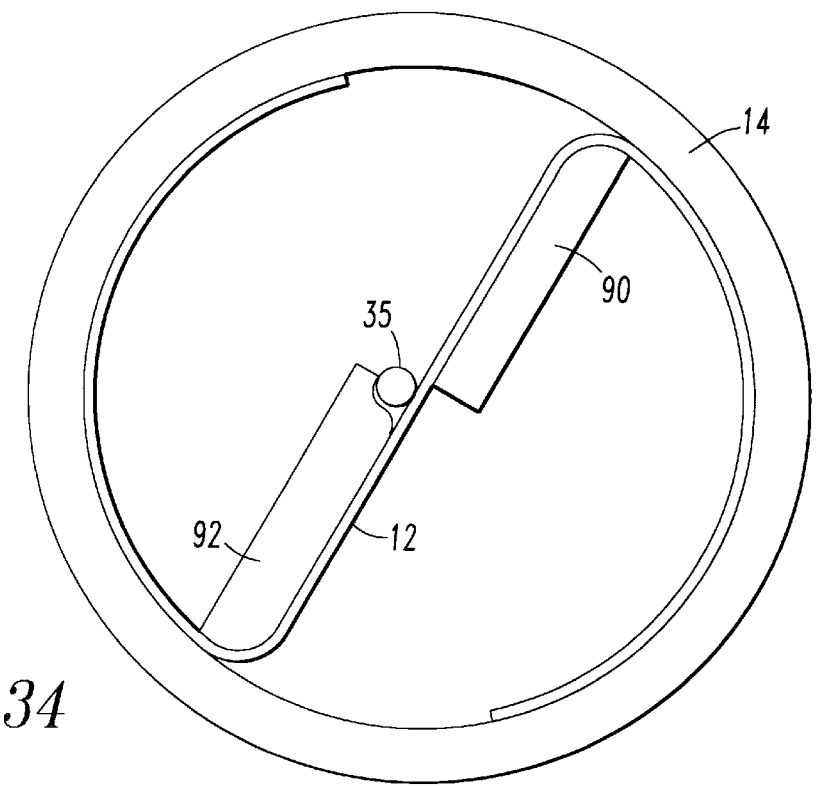
Figure 35:
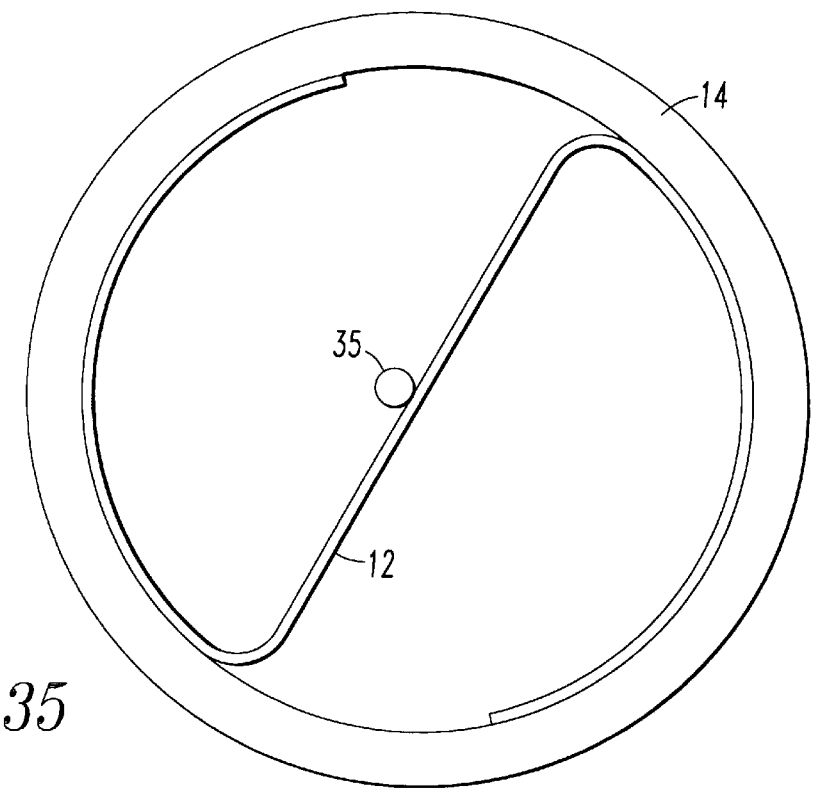
Figure 1:
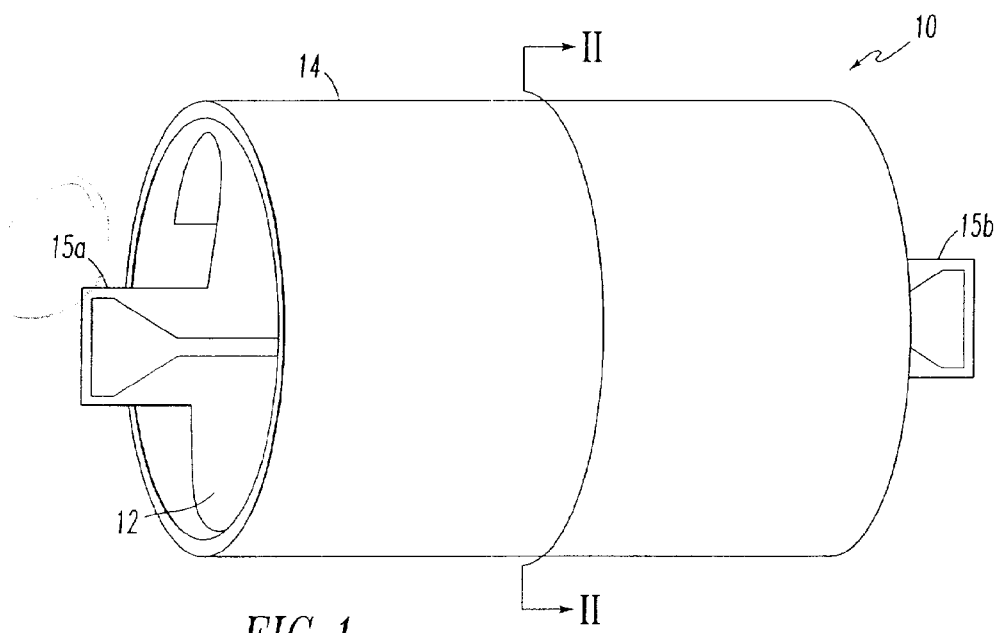
Figure 7:
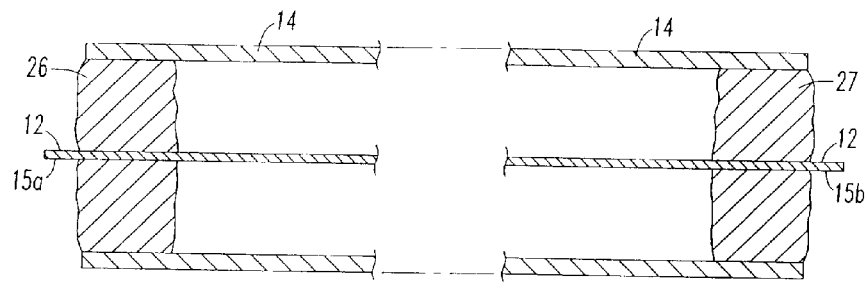
Figure 8:
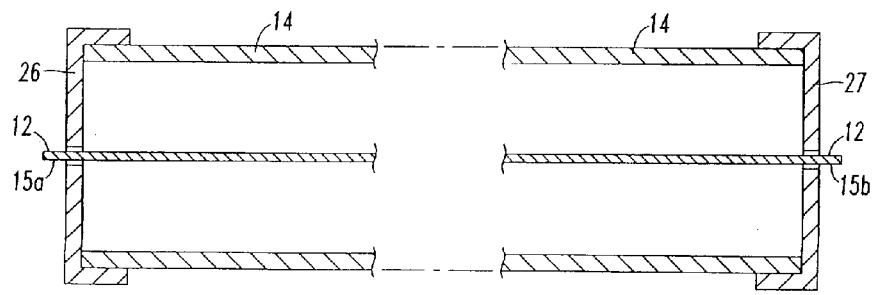

FIGS. 32–35 illustrate how a circuit 12 may be bent and placed within a tube 14. As illustrated in FIG. 32, the circuit may be placed on a mandrel having inner portions 90, 92 that will impart the desired shape to the circuit 12. The inner portions 90, 92 of the mandrel may have an alignment index, such as a recess 92 into which a center conductor 35 may be placed, to facilitate proper alignment of the circuit 12. As illustrated in FIG. 33, the circuit 12 and inner portions 90, 92 may be rotated relative to outer portions 96, 98 of the mandrel to bend the circuit 12 around the inner portions 90, 92 of the mandrel. As illustrated in FIG. 34, after the circuit 12 is properly shaped, it may be inserted, along with the inner portions 90, 92 of the mandrel, into the tube 14. Thereafter, as illustrated in FIG. 35, the inner portions 90, 92 of the mandrel may be removed, leaving the circuit 12 within the tube 14.

If the circuit 12 includes circuit elements that protrude from the surface of the substrate, the inner portions 90, 92 of the mandrel may include recesses to accommodate the circuit elements. In that embodiment, the inner portions 90, 92 of the mandrel may be rotated to disengage the circuit elements from the inner portions 90, 92 of the mandrel before the inner portions 90, 92 of the mandrel are removed from the tube 14.

Those of ordinary skill in the art will recognize that many modifications and variations of the present invention may be implemented. The foregoing description and the following claims are intended to cover all such modifications and variations. Furthermore, the materials and processes disclosed all illustrative of the invention, but are not exhaustive. Other materials and processes may also be used to make devices embodying the present invention.

What is claimed is:

1. A device, comprising:
   an electrically conductive tube; and
   a flexible circuit disposed within said tube, said circuit including a first portion parallel to and engaging an inner surface of said tube, a second portion parallel to and engaging said inner surface of said tube, and a third portion connected between said first and second portions and not engaging said tube.

2. The device of claim 1, wherein said tube has a cross-sectional shape selected from the group comprising circular, elliptical, oval, square, and rectangular.

3. The device of claim 1, wherein said first and second portions of said circuit are in tension engagement with said tube.

4. The device of claim 1, wherein said first portion of said circuit includes a cantilevered spring portion and said second portion of said circuit includes a cantilevered spring portion.

5. The device of claim 1, wherein said third portion of said circuit is planer.

6. The device of claim 5, wherein said circuit has an "S"-shaped cross-section.

7. The device of claim 5, wherein said circuit has a "Z"-shaped cross-section.

8. The device of claim 1, wherein said circuit has a first protruding portion extending from said tube.

9. The device of claim 8 wherein said first protruding portion includes a first connector.

10. The device of claim 8, wherein said circuit includes a second protruding portion extending from said tube.

11. The device of claim 10, wherein said second protruding portion includes a second connector.

12. The device of claim 1, wherein said circuit has a cylindrical form.

13. The device of claim 12, wherein said tube has a longitudinal axis and said circuit includes a central conductor along the longitudinal axis of said tube.

14. The device of claim 13, wherein said circuit includes a radial portion connected to said central conductor.

15. The device of claim 1, wherein said circuit includes a flexible substrate and at least one circuit element.

16. The device of claim 15, wherein said at least one circuit element is printed onto said substrate.

17. The device of claim 15, wherein said at least one circuit element is a discrete circuit element connected to said substrate.

18. The device of claim 15 wherein said substrate includes a first side, a second side, and said at least one circuit element printed on each of said first side and said second side.

19. The device of claim 15, wherein said substrate is multi-layered.

20. The device of claim 15, wherein said at least one circuit element is selected from the group comprising an electrical conductor and a doped semiconductor.

21. The device of claim 15, wherein said at least one circuit element is selected from the group comprising a capacitor, an inductor, a transistor, a diode, and an integrated circuit.

22. The device of claim 1, wherein said circuit includes at least one conductive member connected thereto which when combined with said tube form a device selected from the group comprising a filter, a directional coupler, a power divider, an amplifier, a mixer, and a fuse.

23. The device of claim 1, wherein said circuit includes at least one conductive member connected thereto which when combined with said tube form a filter selected from the group comprising a lowpass filter, a bandpass filter, a bandstop filter, and a highpass filter.

24. The device of claim 1, wherein said tube includes a first end and a second end, and further comprising a first enclosure at said first end and a second enclosure at said second end.

25. The device of claim 24, wherein at least one of said first and second enclosures engages an inner surface of said tube.

26. The device of claim 24, wherein at least one of said first and second enclosures engages an outer surface of said tube.

27. The device of claim 24, wherein at least one of said first and second enclosures includes a dielectric.

28. The device of claim 27, further comprising a first conductor connected to said circuit and extending through said first enclosure.

29. The device of claim 28, further comprising a second conductor connected to said circuit and extending through said second enclosure.

30. The device of claim 24, wherein said circuit includes a service loop.

31. The device of claim 24, wherein said circuit includes a plurality of service loops.

32. The device of claim 24, wherein said circuit has a length that is greater than a length of said tube between said first enclosure and said second enclosure.

33. The device of claim 24, wherein said first and second enclosures each include an opening.

34. The device of claim 24, wherein said circuit includes a first end extending through said first enclosure, and a second end extending through said second enclosure.

35. The device of claim 1, wherein:
said tube defines an opening therein; and
said circuit defines an opening therein corresponding to said opening in said tube.

36. The device of claim 35, further comprising an electrical conductor disposed in said opening in said tube and disposed in said opening in said circuit.

37. The device of claim 36, wherein said electrical conductor is a tuning screw.

38. The device of claim 35, further comprising a dielectric disposed in said opening in said tube and disposed in said opening in said circuit.

39. The device of claim 1, wherein said circuit includes a moveable circuit element.

40. The device of claim 39, wherein said moveable circuit element is a flap defined by a cut in said circuit.

41. The device of claim 39, wherein said tube includes a deformation therein and wherein said tube and said moveable circuit element define a gap therebetween.

42. The device of claim 41, wherein said deformation is a dimple in said tube.

* * * * *

UNITED STATES PATENT AND TRADEMARK OFFICE
CERTIFICATE OF CORRECTION

PATENT NO.    : 6,118,072
DATED         : September 12, 2000
INVENTOR(S)   : Scott It is certified that error appears in the above-identified patent and that said Letters Patent is hereby corrected as shown below:

Drawings,
Please replace Figures 1, 7 and 8 with the attached Figures 1, 7 and 8 showing reference numerals 15a and 15b.

Column 10,
Line 23, please delete the word "all" and insert the word -- are -- therefor Signed and Sealed this Tenth Day of September, 2002

Attest:

JAMES E. ROGAN
Attesting Officer  Director of the United States Patent and Trademark Office